(12) United States Patent
Jo et al.

(10) Patent No.: US 12,210,773 B2
(45) Date of Patent: Jan. 28, 2025

(54) STORAGE DEVICE FOR TRANSMITTING DATA HAVING AN EMBEDDED COMMAND IN BOTH DIRECTIONS OF A SHARED CHANNEL, AND A METHOD OF OPERATING THE STORAGE DEVICE

(71) Applicant: SAMSUNG ELECTRONICS CO., LTD., Suwon-si (KR)

(72) Inventors: Youngmin Jo, Hwaseong-si (KR); Tongsung Kim, Suwon-si (KR); Chiweon Yoon, Seoul (KR); Seonkyoo Lee, Hwaseong-si (KR); Byunghoon Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 98 days.

(21) Appl. No.: 17/528,285

(22) Filed: Nov. 17, 2021

(65) Prior Publication Data
US 2022/0229599 A1  Jul. 21, 2022

(30) Foreign Application Priority Data
Jan. 21, 2021  (KR) ........................ 10-2021-0008793

(51) Int. Cl.
*G06F 3/06*  (2006.01)
*G11C 16/04*  (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC ............. G06F 13/1657; G06F 13/1668; G06F 13/4072; G06F 13/4282; G06F 3/0604;
(Continued)

(56) References Cited

U.S. PATENT DOCUMENTS 6,356,106 B1  3/2002  Greeff et al.
6,496,879 B2  12/2002  Hirabayashi et al.
(Continued)

FOREIGN PATENT DOCUMENTS

DE  102012110732  6/2013
JP  H10327174  12/1998

OTHER PUBLICATIONS

European Search Report issued in corresponding EP Patent Application No. 21209514.5 on May 20, 2022.

*Primary Examiner* — Yong J Choe
(74) *Attorney, Agent, or Firm* — F. CHAU & ASSOCIATES, LLC

(57) ABSTRACT

A method of operating a storage device including first and second memory devices and a memory controller, which are connected to a single channel, the method including: transmitting first data output from the first memory device to the memory controller through a data signal line in the single channel; and transmitting a command to the second memory device through the data signal line while the memory controller receives the first data, wherein a voltage level of the data signal line is based on the command and the first data of the first memory device is loaded on the data signal line, and the first data and the command are transmitted in both directions of the data signal line.

12 Claims, 17 Drawing Sheets

(51) Int. Cl.
  *G11C 16/10*    (2006.01)
  *G11C 16/26*    (2006.01)
  *H03K 19/00*    (2006.01)
  *H10B 43/27*    (2023.01)

(52) U.S. Cl.
  CPC .......... *G11C 16/0483* (2013.01); *G11C 16/10* (2013.01); *G11C 16/26* (2013.01); *H03K 19/0005* (2013.01); *H10B 43/27* (2023.02)

(58) Field of Classification Search
  CPC ...... G06F 3/061; G06F 3/0659; G06F 3/0679; G06F 3/0688
  See application file for complete search history.

(56) References Cited

U.S. PATENT DOCUMENTS

| | | | |
|---|---|---|---|
| 6,717,832 B2 | 4/2004 | Johnson et al. | |
| 7,224,737 B2 | 5/2007 | Voutilainen | |
| 7,558,131 B2 | 7/2009 | Han | |
| 8,341,338 B2 | 12/2012 | Lee et al. | |
| 8,516,214 B2 * | 8/2013 | Ochiai | G06F 12/00 711/E12.001 |
| 9,306,566 B2 | 4/2016 | Oh et al. | |
| 9,431,078 B2 | 8/2016 | Takeyama et al. | |
| 10,002,671 B2 | 6/2018 | Shimizu et al. | |
| 2014/0085983 A1 * | 3/2014 | Hosono | G11C 16/0483 365/185.17 |
| 2015/0280783 A1 | 10/2015 | Seifried | |
| 2018/0151218 A1 * | 5/2018 | Yun | G06F 3/0659 |
| 2019/0303007 A1 | 10/2019 | Hong et al. | |
| 2021/0012754 A1 * | 1/2021 | Lim | G09G 5/363 |

\* cited by examiner

STORAGE DEVICE FOR TRANSMITTING DATA HAVING AN EMBEDDED COMMAND IN BOTH DIRECTIONS OF A SHARED CHANNEL, AND A METHOD OF OPERATING THE STORAGE DEVICE

CROSS-REFERENCE TO RELATED APPLICATION

This application claims priority under 35 U.S.C. § 119 to Korean Patent Application No. 10-2021-0008793, filed on Jan. 21, 2021, in the Korean Intellectual Property Office, the disclosure of which is incorporated by reference herein in its entirety.

TECHNICAL FIELD

The inventive concept relates to a semiconductor device, and more particularly, to a storage device for simultaneously transmitting data having an embedded command in both directions of a shared channel, and a method of operating the storage device.

DISCUSSION OF RELATED ART

A system using semiconductor chips may employ a memory controller and a storage device. A volatile memory such as dynamic random-access memory (DRAM) may be used as an operation memory or main memory of the system and a non-volatile memory may be used as a storage device as a storage medium to store data or instructions used by a host within the system and/or perform a computational operation. The storage device may include a plurality of non-volatile memories. As the capacity of the storage device increases, there is a need to increase the data input/output efficiency of the non-volatile memories to provide stable and fast real-time processing of large amounts of data.

The storage device may support a plurality of channels, and the non-volatile memories may be connected to one of the plurality of channels. For example, first and second non-volatile memories may be connected to the same channel. Non-volatile memories connected to a single channel share a data signal (DQ) line, and may receive commands, addresses, and data from a memory controller or transmit data to the memory controller, through the shared DQ line. Each of the non-volatile memories connected to the single channel may receive a corresponding read command, perform a read operation, and transmit data read according to the read operation to the memory controller through the shared DQ line.

Accordingly, the memory controller may serially transmit and receive a read command and data through the shared DQ line for each of the non-volatile memories connected to the single channel. Moreover, the data transmitted through the shared DQ line may have a relatively high transmission rate based on a high frequency toggle timing, whereas the read command may have a relatively low transmission rate. Accordingly, the data input/output efficiency of the shared DQ line may drop.

SUMMARY

Embodiments of the inventive concept provide a storage device for simultaneously transmitting data having an embedded command in both directions of a channel, and a method of operating the storage device.

According to an embodiment of the inventive concept, there is provided a method of operating a storage device including first and second memory devices and a memory controller, which are connected to a single channel, the method including: transmitting first data output from the first memory device to the memory controller through a data signal line in the single channel; and transmitting a command to the second memory device through the data signal line while the memory controller receives the first data, wherein a voltage level of the data signal line is based on the command and the first data of the first memory device is loaded on the data signal line, and the first data and the command are transmitted in both directions of the data signal line.

According to an embodiment of the inventive concept, there is provided a method of operating a storage device including first and second memory devices and a memory controller, which are connected to a single channel, the method including: transmitting first data output from the first memory device to the memory controller through a data signal line in the single channel; and transmitting write data for the second memory device to the second memory device through the data signal line while the memory controller receives the first data, wherein a voltage level of the data signal line is based on the write data and the first data is loaded on the data signal, and the first data and the write data are transmitted in both directions of the data signal line in the single channel.

According to an embodiment of the inventive concept, there is provided a memory controller for controlling a plurality of memory devices, the memory controller including: at least one data signal pin connected to a data signal line in a single channel connected between the memory controller and the plurality of memory devices; a data extraction circuit that receives, through the at least one data signal pin, output data output from a first memory device among the plurality of memory devices and obtains internal data corresponding to the output data of the first memory device; a command logic circuit that generates a command to be provided to a second memory device among the plurality of memory devices and outputs control signals based on the command; and a switch circuit that transmits the command for the second memory device to the second memory device through the at least one data signal pin and the data signal line in response to the control signals, wherein the output data of the first memory device and the command for the second memory device are transmitted in both directions of the data signal line in the single channel.

According to an embodiment of the inventive concept, there is provided a memory controller for controlling a plurality of memory devices, the memory controller including: at least one data signal pin connected to a data signal line in a single channel connected between the memory controller and the plurality of memory devices; a data extraction circuit that receives, through the at least one data signal pin, output data output from a first memory device among the plurality of memory devices and obtains internal data corresponding to the output data of the first memory device; a data logic circuit that generates write data to be provided to a second memory device among the plurality of memory devices and outputs control signals based on the write data; and a switch circuit that transmits the write data for the second memory device to the second memory device through the at least one data signal pin and the data signal line in response to the control signals, wherein the output data of the first memory device and the write data for the second memory device are transmitted in different directions in the data signal line in the single channel.

According to an embodiment of the inventive concept, there is provided a storage device including: a plurality of memory devices; a memory controller that controls the plurality of memory devices; and a single channel connected between the memory controller and the plurality of memory devices and including at least one data signal line, wherein a first memory device among the plurality of memory devices transmits output data output in response to a first read command of the memory controller to the memory controller through the at least one data signal line, the memory controller transmits a second read command for a second memory device among the plurality of memory devices to the second memory device through the at least one data signal line while receiving the output data of the first memory device, the memory controller changes a voltage level of the at least one data signal line based on the second read command for the second memory device and the output data of the first memory device is loaded on the at least one data signal line having the changed voltage level, and the output data of the first memory device and the second read command for the second memory device are transmitted in first and second directions of the at least one data signal line of the single channel.

According to an embodiment of the inventive concept, there is provided a storage device including: a plurality of memory devices; a memory controller that controls the plurality of memory devices; and a single channel connected between the memory controller and the plurality of memory devices and including at least one data signal line, wherein a first memory device among the plurality of memory devices transmits output data output from the first memory device to the memory controller through the at least one data signal line, the memory controller transmits write data for a second memory device among the plurality of memory devices to the second memory device through the at least one data signal line while receiving the output data of the first memory device, a voltage level of the at least one data signal line is changed based on the write data for the second memory device and the output data of the first memory device is loaded on the at least one data signal line having the changed voltage level, and the output data of the first memory device and the write data for the second memory device are transmitted in first and second directions of the at least one data signal line of the single channel.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
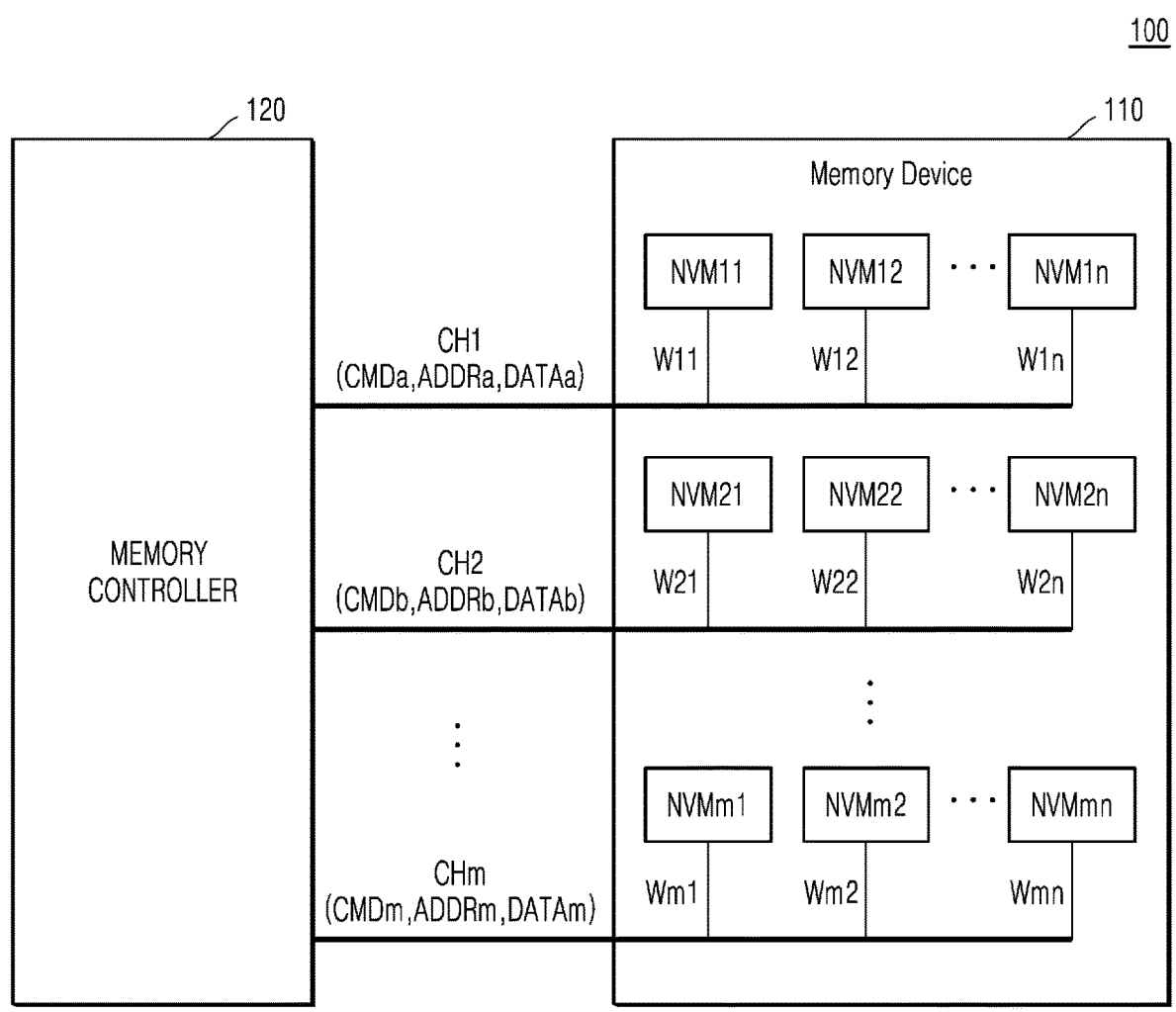
FIG. 1 is a block diagram of a storage device according to embodiments of the inventive concept.

FIG. 1 is a block diagram of a storage device 100 according to embodiments of the inventive concept.

Referring to FIG. 1, the storage device 10 may include a memory device 110 and a memory controller 120. Although in the present embodiment the storage device 100 is shown including a plurality of hardware components, the inventive concept is not limited thereto, and other components may be included. The memory controller 120 may control the memory device 110 to write data to the memory device 110, in response to a write request from a host, or may control the memory device 110 to read data stored in the memory device 110, in response to a read request from the host.

In some embodiments of the inventive concept, the storage device 100 may include an internal memory that is embedded in an electronic device. For example, the storage device 100 may include an embedded universal flash storage (UFS) memory device, an embedded multi-media card (eMMC), or a solid state drive (SSD). However, the inventive concept is not limited thereto, and the storage device 100 may include a non-volatile memory (e.g., a one-time programmable read-only memory (OTPROM), a programmable ROM (PROM), an erasable and programmable ROM (EPROM), an electrically erasable and programmable ROM (EEPROM), a mask ROM, a flash ROM, or the like). In some embodiments of the inventive concept, the storage device 100 may include an external memory that is detachable from an electronic device. For example, the storage device 100 may include at least one of a UFS memory card, a compact flash (CF) card, a secure digital (SD) card, a micro-SD card, a mini-SD card, an extreme digital (xD) card, and a memory stick.

The storage device 100 may support a plurality of channels CH1 to CHm, and the memory device 110 may be connected to the memory controller 120 through the plurality of channels CH1 to CHm. The memory device 110 may include a plurality of non-volatile memory devices NVM11 to NVMmn. Each of the non-volatile memory devices NVM11 to NVMmn may be connected to one of the plurality of channels CH1 to Chm through a corresponding way. For example, the non-volatile memory devices NVM11 to NVM1n may be respectively connected to a first channel CH1 through ways W11 to W1n, and the non-volatile memory devices NVM21 to NVM2n may be respectively connected to a second channel CH2 through ways W21 to W2n. In addition, the non-volatile memory devices NVMm1 to NVMmn may be respectively connected to an mth channel CHm through ways Wm1 to Wmn. In an embodiment of the inventive concept, each of the non-volatile memory devices NVM11 to NVMmn may be implemented by any memory unit capable of operating according to an individual command from the memory controller 120. For example, although each of the non-volatile memory devices NVM11 to NVMmn may be implemented by a chip or a die, the inventive concept is not limited thereto.

The memory controller 120 may transmit signals to and receive signals from the memory device 110 through the plurality of channels CH1 to CHm. For example, the memory controller 120 may transmit commands CMDa to CMDm, addresses ADDRa to ADDRm, and data DATAa to DATAm to the memory device 110 through the channels CH1 to CHm or may receive the data DATAa to DATAm from the memory device 110.

The memory controller 120 may select, through each channel, one of the non-volatile memory devices connected to the corresponding channel and may transmit signals to and receive signals from the selected non-volatile memory device. For example, the memory controller 120 may select a non-volatile memory device NVM11 from among the non-volatile memory devices NVM11 to NVM1n connected to the first channel CH1. The memory controller 120 may transmit the command CMDa, the address ADDRa, and the data DATAa to the selected non-volatile memory device NVM11 or may receive the data DATAa from the selected non-volatile memory device NVM11, through the first channel CH1.

The memory controller 120 may transmit signals to and receive signals from the memory device 110 in parallel through different channels. For example, the memory controller 120 may transmit the command CMDb to the memory device 110 through the second channel CH2 while transmitting the command CMDa to the memory device 110 through the first channel CH1. For example, the memory controller 120 may receive the data DATAb from the memory device 110 through the second channel CH2 while receiving the data DATAa from the memory device 110 through the first channel CH1. In addition, the memory device 110 may receive the data DATAb from the memory controller 120 through the second channel CH2 while receiving the data DATAa from the memory controller 120 through the first channel CH1.

The memory controller 120 may control overall operations of the memory device 110. The memory controller 120 may control each of the non-volatile memory devices NVM11 to NVMmn connected to the channels CH1 to CHm by transmitting signals to the channels CH1 to CHm. For example, the memory controller 120 may control one selected from among the non-volatile memory devices NVM11 to NVM1n by transmitting the command CMDa and the address ADDRa to the first channel CH1.

Each of the non-volatile memory devices NVM11 to NVMmn may be operated according to control by the memory controller 120. For example, a first non-volatile memory device NVM11 may program the data DATAa according to the command CMDa, the address ADDRa, and the data DATAa, which are provided to the first channel CH1. For example, a second non-volatile memory device NVM21 may read the data DATAb according to the command CMDb and the address ADDRb, which are provided to the second channel CH2, and may transmit the read data DATAb to the memory controller 120.

The memory controller 120 may transmit a command for a second non-volatile memory device NVM12 to the second non-volatile memory device NVM12 through a data signal line of the first channel CH1 while receiving, through a data signal line in the first channel CH1, output data output from the first non-volatile memory device NVM11 among the non-volatile memory devices NVM11 to NVM1n connected to a single channel, for example, the first channel CH1. The memory controller 120 may change a voltage level of a data signal line of the first channel CH1 based on a command for the second non-volatile memory device NVM12. Accordingly, output data output from the first non-volatile memory device NVM11 may be loaded on the data signal line of the first channel CH1 having the changed voltage level, and the output data of the first non-volatile memory device NVM11 and the command for the second non-volatile memory device NVM12 may be transmitted in both directions of the data signal line of the first channel CH1. In other words, information may be simultaneously transmitted in both directions of a channel. For example, information may be simultaneously transmitted in first and second directions of a channel. The first and second directions may be opposite to each other.

Although FIG. 1 illustrates that the memory device 110 communicates with the memory controller 120 through in channels and includes n non-volatile memory devices in correspondence with each channel, the number of channels and the number of non-volatile memory devices connected to a single channel may be variously changed.

Figure 2:
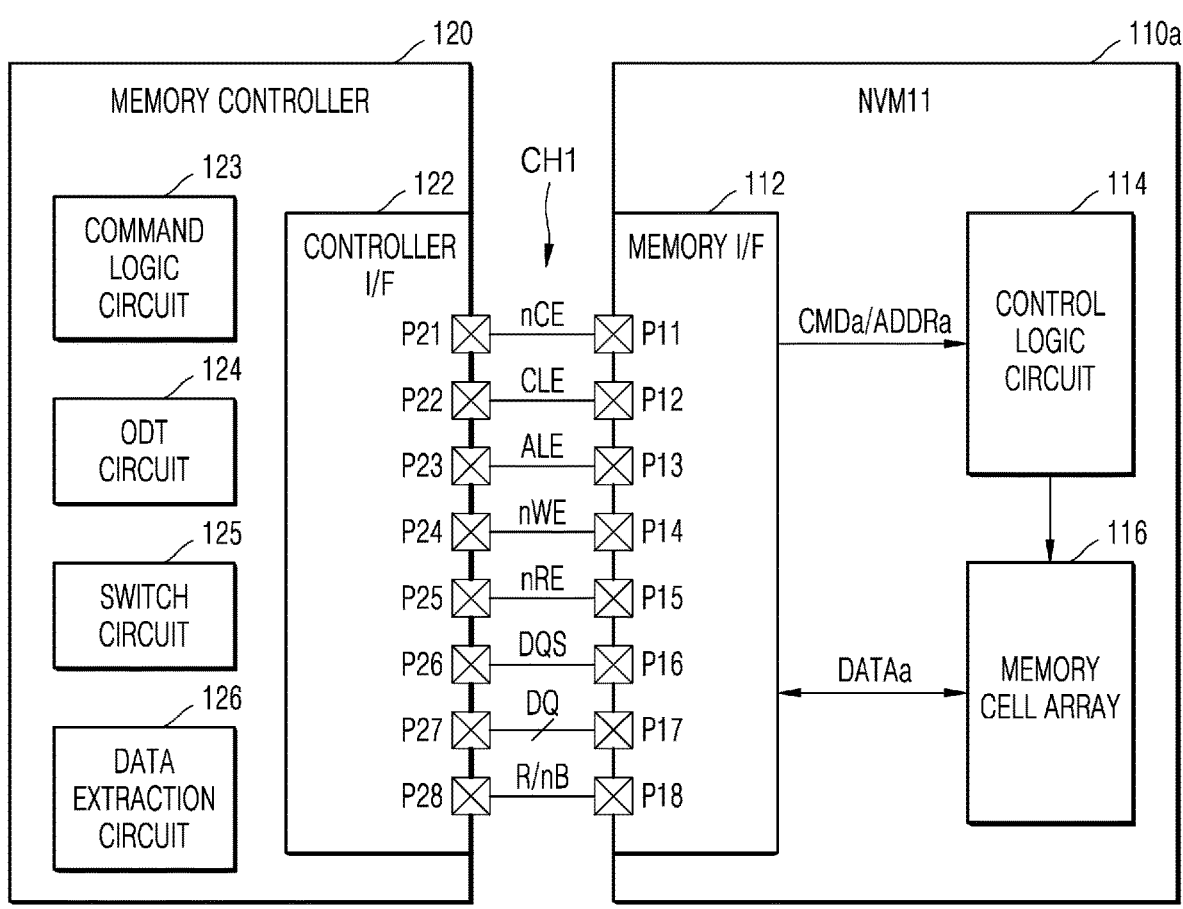
FIG. 2 is a diagram illustrating a memory interface associated with a first channel of the storage device of FIG. 1.

FIG. 2 is a diagram illustrating a memory interface associated with the first channel CH1 of the storage device 100 of FIG. 1.

Referring to FIGS. 1 and 2, the memory controller 120 may select the first non-volatile memory device NVM11 (hereinafter, referred to as a first NVM 110a) from among the non-volatile memory devices NVM11 to NVM1n connected to the first channel CH1. The memory controller 120 is connected to the first NVM 110a through the first channel CH1. The first NVM 110a may include first, second, third, fourth, fifth, sixth, seventh and eighth pins P11, P12, P13, P14, P15, P16, P17 and P18, a memory interface circuit 112, a control logic circuit 114, and a memory cell array 116.

The memory interface circuit 112 may receive a chip enable signal nCE from the memory controller 120 through the first pin P11. The memory interface circuit 112 may transmit signals to and receive signals from the memory controller 120 through the second to eighth pins P12 to P18 according to the chip enable signal nCE. For example, when the chip enable signal nCE is in an enabled state (for example, a low level), the memory interface circuit 112 may transmit signals to and receive signals from the memory controller 120 through the second to eighth pins P12 to P18. When the chip enable signal nCE is in a not-enabled state, the memory interface circuit 112 may not transmit signals to and receive signals from the memory controller 120.

The memory interface circuit 112 may receive a command latch enable signal CLE, an address latch enable signal ALE, and a write enable signal nWE from the memory controller 120 through the second to fourth pins P12 to P14. The memory interface circuit 112 may receive a data signal DQ from the memory controller 120 or may transmit the data signal DQ to the memory controller 120, through the seventh pin P17. A command CMDa, an address ADDRa, and data DATAa may be transferred through the data signal DQ. For example, the data signal DQ may be transferred through a plurality of data signal lines. In this case, the seventh pin P17 may include a plurality of pins corresponding to a plurality of data signals.

The memory interface circuit 112 may obtain the command CMDa from the data signal DQ received in an enabled period (for example, a high-level state) of the command latch enable signal CLE, based on toggle timings of the write enable signal nWE. The memory interface circuit 112 may obtain the address ADDRa from the data signal DQ received in an enabled period (for example, a high-level state) of the address latch enable signal ALE, based on the toggle timings of the write enable signal nWE.

In an embodiment of the inventive concept, the write enable signal nWE may be maintained in a static state (for example, a high level or a low level) and then may toggle between the high level and the low level. For example, the write enable signal nWE may toggle in a period in which the command CMDa or the address ADDRa is transmitted. Accordingly, the memory interface circuit 112 may obtain the command CMDa or the address ADDRa, based on the toggle timings of the write enable signal nWE.

The memory interface circuit 112 may receive a read enable signal nRE from the memory controller 120 through the fifth pin P15. The memory interface circuit 112 may receive a data strobe signal DQS from the memory controller 120 or transmit the data strobe signal DQS to the memory controller 120, through the sixth pin P16.

In a data output operation of the first NVM 110a, the memory interface circuit 112 may receive the read enable signal nRE that toggles, through the fifth pin P15, before the data DATAa is output. The memory interface circuit 112 may generate the data strobe signal DQS that toggles, based on the toggling of the read enable signal nRE. For example, the memory interface circuit 112 may generate the data strobe signal DQS that starts to toggle after a preset delay (for example, tDQSRE) from a toggling start time of the read enable signal nRE. The memory interface circuit 112 may transmit the data signal DQ including the data DATAa, based on a toggle timing of the data strobe signal DQS. Accordingly, the data DATAa may be transmitted to the memory controller 120 in alignment with the toggle timing of the data strobe signal DQS.

In a data input operation of the first NVM 110a, when the data signal DQ including the data DATAa is received from the memory controller 120, the memory interface circuit 112 may receive the data strobe signal DQS that toggles, together with the data DATAa, from the memory controller 120. The memory interface circuit 112 may obtain the data DATAa from the data signal DQ, based on the toggle timing of the data strobe signal DQS. For example, the memory interface circuit 112 may obtain the data DATA by sampling the data signal DQ at a rising edge and a falling edge of the data strobe signal DQS.

The memory interface circuit 112 may transmit a ready/busy output signal R/nB through the eighth pin P18. The memory interface circuit 112 may transmit state information of the first NVM 110a to the memory controller 120 through the ready/busy output signal R/nB. When the first NVM 110a is in a busy state (in other words, when internal operations of the first NVM 110a are being performed), the memory interface circuit 112 may transmit, to the memory controller 120, the ready/busy output signal R/nB indicating the busy state. When the first NVM 110a is in a ready state (in other words, when the internal operations of the first NVM 110a are not being performed or are completed), the memory interface circuit 112 may transmit, to the memory controller 120, the ready/busy output signal R/nB indicating the ready state. For example, while the first NVM 110a reads the data DATAa from the memory cell array 116 in response to a page read command, the memory interface circuit 112 may transmit, to the memory controller 120, the ready/busy output signal R/nB indicating the busy state (for example, a low level). For example, while the first NVM 110a programs the data DATAa into the memory cell array 116 in response to a program command, the memory interface circuit 112 may transmit, to the memory controller 120, the ready/busy output signal R/nB indicating the busy state (for example, a low level).

The control logic circuit 114 may take overall control of various operations of the first NVM 110a. The control logic circuit 114 may receive a command/address CMDa/ADDRa obtained from the memory interface circuit 112. The control logic circuit 114 may generate control signals for controlling the other components of the first NVM 110a, according to the received command/address CMDa/ADDRa. For example, the control logic circuit 114 may generate various control signals for programming the data DATAa into the memory cell array 116 or reading the data DATAa from the memory cell array 116.

The memory cell array 116 may store the data DATAa obtained from the memory interface circuit 112, according to control by the control logic circuit 114. The memory cell array 116 may output the stored data DATAa to the memory interface circuit 112, according to control by the control logic circuit 114.

The memory cell array 116 may include a plurality of memory cells. For example, the plurality of memory cells may include flash memory cells. However, the inventive concept is not limited thereto, and the memory cells may include resistive random access memory (RRAM) cells, ferroelectric RAM (FRAM) cells, phase-change RAM (PRAM) cells, thyristor RAM (TRAM) cells, or magnetoresistive RAM (MRAM) cells. According to an embodiment of the inventive concept, the memory cells may include static RAM (SRAM) cells or dynamic RAM (DRAM) cells. Hereinafter, embodiments of the inventive concept, in which the memory cells are NAND flash memory cells, will be mainly described.

The memory controller 120 may include first, second, third, fourth, fifth, sixth, seventh and eighth pins P21, P22, P23, P24, P25, P26, P27 and P28, a controller interface circuit 122, a command logic circuit 123, an on-die termination (ODT) circuit 124, a switch circuit 125, and a data extraction circuit 126. The first to eighth pins P21 to P28 may respectively correspond to the first to eighth pins P11 to P18 of the first NVM 110a. In other words, the first pin P21 may be connected to the first pin P11 and the eighth pin P28 may be connected to the eighth pin P18.

The controller interface circuit 122 may transmit the chip enable signal nCE to the first NVM 110a through the first pin P21. The controller interface circuit 122 may transmit signals to and receive signals from the first NVM 110a, which is selected through the chip enable signal nCE, through the second to eighth pins P22 to P28.

The controller interface circuit 122 may transmit the command enable signal CLE, the address latch enable signal ALE, and the write enable signal nWE to the first NVM 110a through the second to fourth pins P22 to P24. The controller interface circuit 122 may transmit the data signal DQ to the first NVM 110a or receive the data signal DQ from the first NVM 110a, through the seventh pin P27.

The controller interface circuit 122 may transmit the data signal DQ including the command CMDa or the address ADDRa, together with the write enable signal nWE that is toggling, to the first NVM 110a. The controller interface circuit 122 may transmit the data signal DQ including the command CMDa when the command latch enable signal CLE having an enabled state is transmitted, and the controller interface circuit 122 may transmit the data signal DQ including the address ADDRa when the address latch enable signal ALE having an enabled state is transmitted.

The controller interface circuit 122 may transmit the read enable signal nRE to the first NVM 110a through the fifth pin P25. The controller interface circuit 122 may receive the data strobe signal DQS from the first NVM 110a or transmit the data strobe signal DQS to the first NVM 110a, through the sixth pin P26.

In a data output operation of the first NVM 110a, the controller interface circuit 122 may generate the read enable signal nRE that toggles, and may transmit the read enable signal nRE to the first NVM 110a. For example, the controller interface circuit 122 may generate the read enable signal nRE, which changes from a static state (for example, a high level or a low level) to a toggle state, before the data DATAa is output. Accordingly, in the first NVM 110a, the data strobe signal DQS, which toggles based on the read enable signal nRE, may be generated. The controller interface circuit 122 may receive the data signal DQ including the data DATAa, together with the data strobe signal DQS that toggles, from the first NVM 110a. The controller interface circuit 122 may obtain the data DATAa from the data signal DQ, based on the toggle timing of the data strobe signal DQS.

In a data input operation of the first NVM 110a, the controller interface circuit 122 may generate the data strobe signal DQS that toggles. For example, the controller interface circuit 122 may generate the data strobe signal DQS, which changes from a static state (for example, a high level or a low level) to a toggle state, before the data DATAa is transmitted. The controller interface circuit 122 may transmit the data signal DQ including the data DATAa to the first NVM 110a, based on toggle timings of the data strobe signal DQS.

The controller interface circuit 122 may receive the ready/busy output signal R/nB from the first NVM 110a through the eighth pin P28. The controller interface circuit 122 may determine the state information of the first NVM 110a, based on the ready/busy output signal R/nB.

While the memory controller 120 receives, through the data signal DQ line and the seventh pin P27, output data output in a data output operation of the first NVM 110a, the command logic circuit 123 may generate a command for another non-volatile memory device (e.g., the second non-volatile memory device NVM12) connected to the first channel CH1. The command logic circuit 123 may output control signals based on a command for the second non-volatile memory device NVM12.

The ODT circuit 124 may provide a termination resistance to the data signal DQ line through the seventh pin P27 to adjust the swing widths and/or driving strengths of signals received through the data signal DQ line and increase signal integrity.

The switch circuit 125 may transmit a command for the second non-volatile memory device NVM12 to the second non-volatile memory device NVM12 through the seventh pin P27 and the data signal DQ line in response to control signals of the command logic circuit 123.

The data extraction circuit 126 may receive, through the data signal DQ line and the seventh pin P27, the output data output in a data output operation of the first NVM 110a, and may obtain internal data corresponding to the output data of the first NVM 110a.

Figure 3:
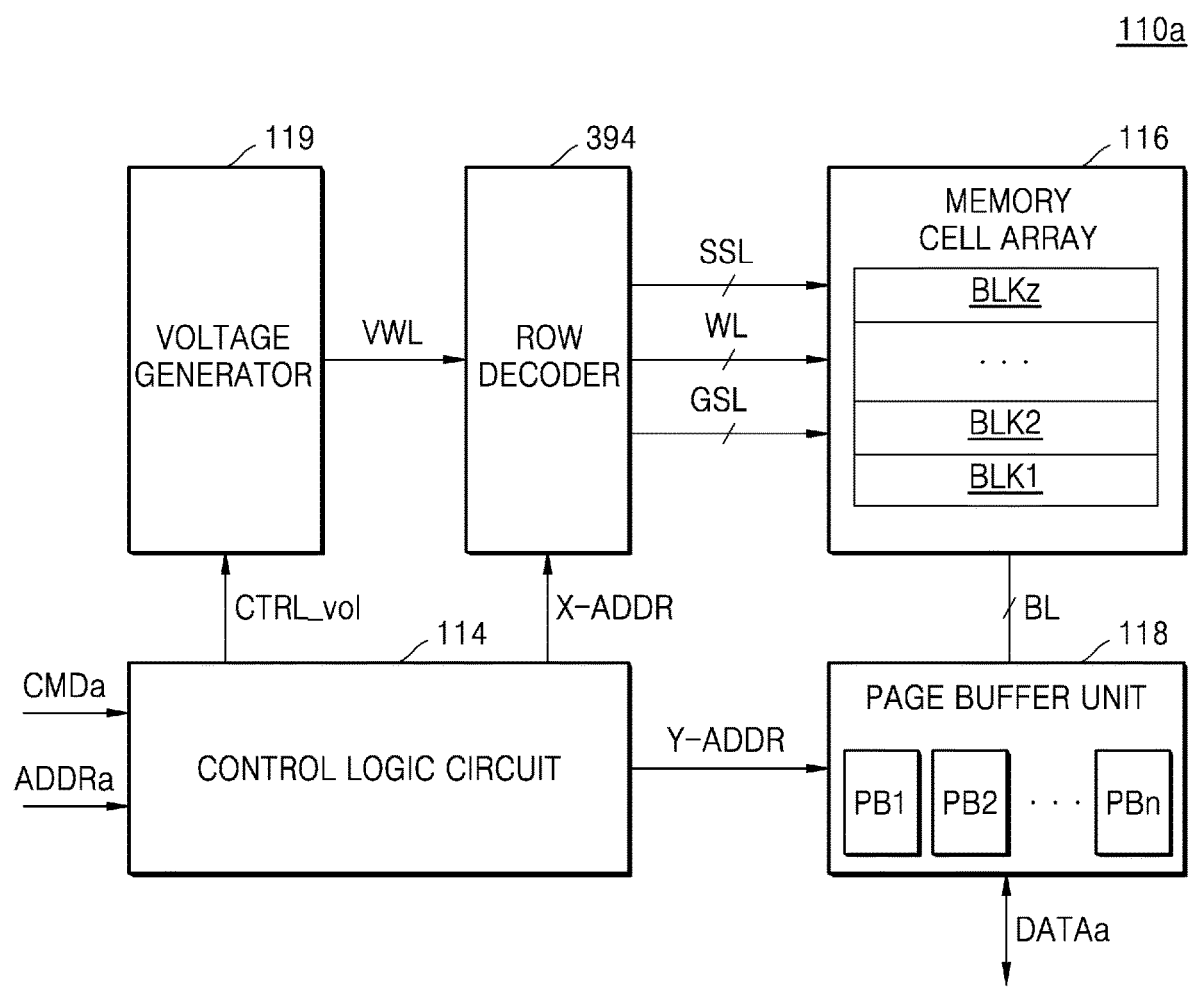
FIG. 3 is a block diagram of a first non-volatile memory device (NVM) illustrated in FIG. 2.

FIG. 3 is a block diagram of the first NVM 110a illustrated in FIG. 2.

Referring to FIG. 3, the first NVM 110a may include a control logic circuit 114, a memory cell array 116, a page buffer unit 118, a voltage generator 119, and a row decoder 394. The first NVM 110a may further include a command decoder, an address decoder, an input/output (I/O) buffer, and the like.

The control logic circuit 114 may control various overall operations of the first NVM 110a. The control logic circuit 114 may output various control signals in response to a command CMDa and/or an address ADDRa from the memory controller 120. For example, the control logic circuit 114 may output a voltage control signal CTRL_vol, a row address X-ADDR, and a column address Y-ADDR.

The memory cell array 116 may include a plurality of memory blocks BLK1 to BLKz, and each of the plurality of memory blocks BLK1 to BLKz may include a plurality of memory cells. The memory cell array 116 may be connected to the page buffer unit 118 via bit lines BL, and may be connected to the row decoder 394 via word lines WL, string selection lines SSL, and ground selection lines GSL.

According to an embodiment of the inventive concept, the memory cell array 116 may include a 3D memory cell array, and the 3D memory cell array may include a plurality of memory NAND strings. Each memory NAND string may include memory cells respectively connected to word lines vertically stacked on a substrate. U.S. Pat. Nos. 7,679,133, 8,553,466, 8,654,587, 8,559,235, and U.S. Patent Application Publication No. 2011/0233648 are incorporated by reference herein in their entireties. According to an embodiment of the inventive concept, the memory cell array 116 may include a two-dimensional (2D) memory cell array, and the 2D memory cell array may include a plurality of memory NAND strings arranged in a column direction and a row direction.

The page buffer unit 118 may include a plurality of page buffers PB1 to PBn (where n is an integer equal to or greater than 2), and the plurality of page buffers PB1 to PBn may be connected to the memory cells via the plurality of bit lines BL, respectively. The page buffer unit 118 may select at least one bit line from the plurality of bit lines BL in response to the column address Y-ADDR. The page buffer circuit 118 may operate as a write driver or a sense amplifier according to operation modes. For example, during a program operation, the page buffer circuit 118 may apply a bit line voltage corresponding to data DATAa that is to be programmed to a selected bit line. During a read operation, the page buffer circuit 118 may sense a current or voltage of the selected bit line to sense the data DATAa stored in a memory cell.

The voltage generator 119 may generate various types of voltages for performing program, read, and erase operations, based on the voltage control signal CTRL_vol. For example, the voltage generator 119 may generate word line voltages VWL, for example, a program voltage, a read voltage, a program verify voltage, and an erase voltage.

The row decoder 394 may select one word line from the plurality of word lines WL in response to the row address X-ADDR, and may select one string selection line from the plurality of string selection lines SSL. For example, during a program operation, the row decoder 394 may apply a program voltage and a program verify voltage to the selected word line, and, during a read operation, the row decoder 394 may apply a read voltage to the selected word line.

Figure 4:
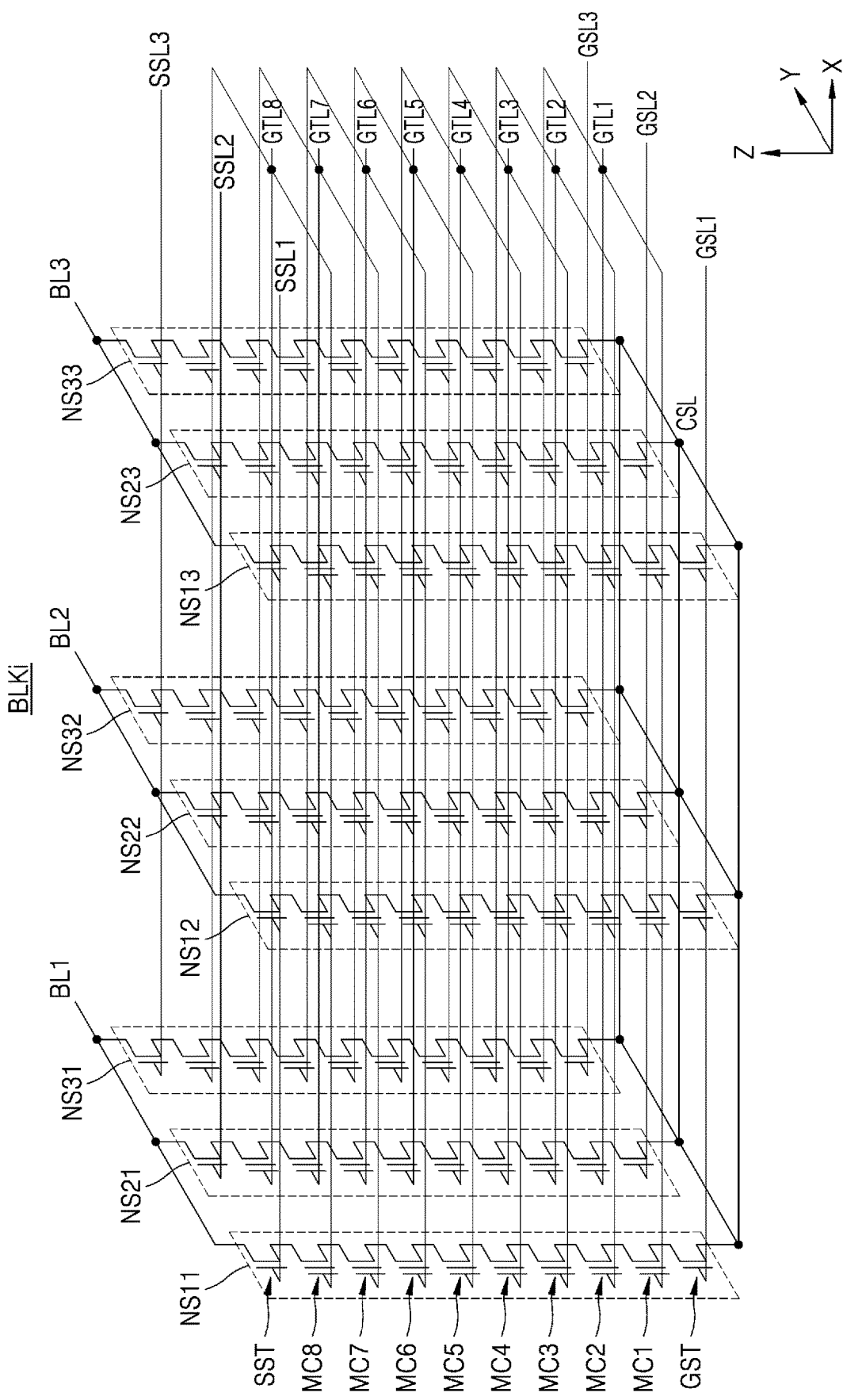
FIGS. 4, 5 and 6 are diagrams for explaining a three-dimensional (3D) vertical-NAND (V-NAND) structure applicable to the first NVM of FIG. 3.
Figure 5:
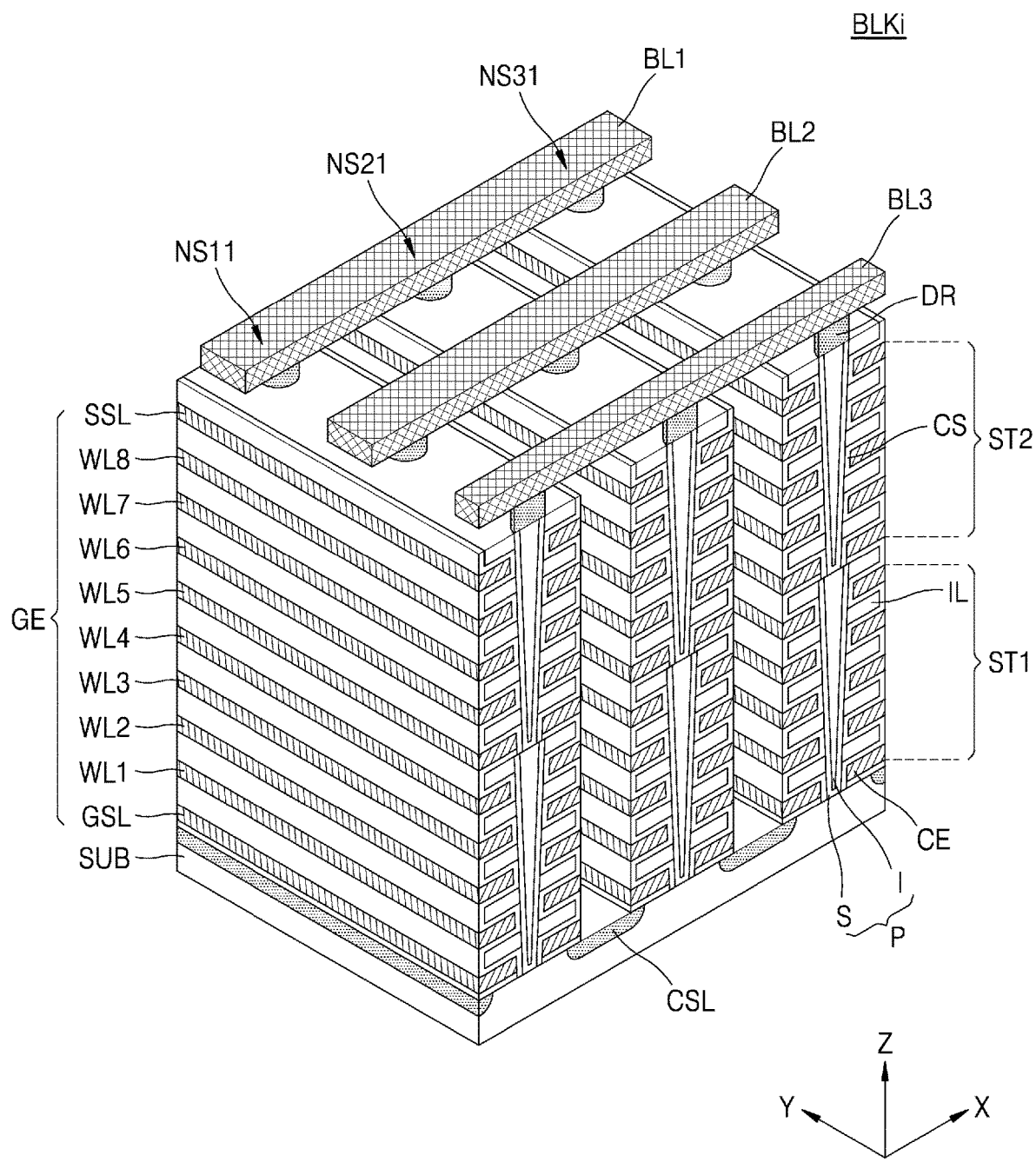
Figure 6:
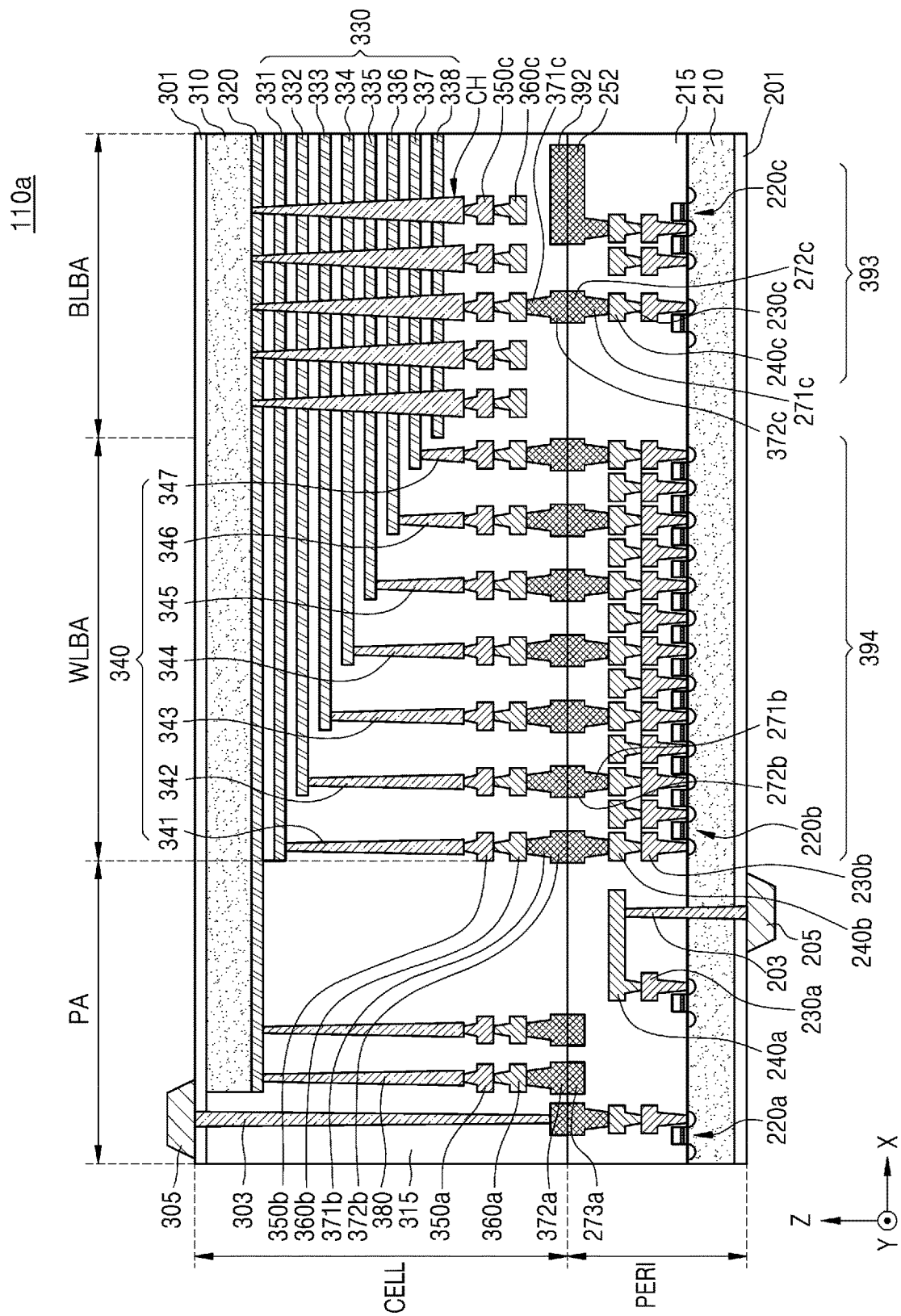

FIGS. 4 to 6 are diagrams for explaining a 3D V-NAND structure applicable to the first NVM 110*a* of FIG. 3. FIG. 4 is an equivalent circuit of a memory block BLKi, and FIG. 5 is a perspective view of the memory block BLKi. FIG. 6 illustrates a first NVM 110*a* having a chip-to-chip (C2C) structure.

Referring to FIG. 4, the memory block BLKi may include a plurality of memory NAND strings NS11, NS12, NS13, NS21, NS22, NS23, NS31, NS32 and NS33 connected between bit lines BL1, BL2, and BL3 and a common source line CSL. Each of the plurality of memory NAND strings NS11 to NS33 may include a string select transistor SST, a plurality of memory cells MC1, MC2, MC3, MC4, MC5, MC6, MC7 and MC8, and a ground select transistor GST. For brevity of illustration, each of the plurality of memory NAND strings NS11 to NS33 includes eight memory cells MC1 to MC8 in FIG. 4. However, the inventive concept is not limited thereto.

The string select transistor SST may be connected to a corresponding one of string selection lines SSL1, SSL2, and SSL3. The plurality of memory cells MC1 to MC8 may be connected to gate lines GTL1, GTL2, GTL3, GTL4, GTL5, GTL6, GTL7 and GTL8, respectively. The gate lines GTL1 to GTL8 may respectively correspond to word lines, and some of the gate lines GTL1 to GTL8 may respectively correspond to dummy word lines. For example, dummy wordlines may be adjacent to the string selection lines SSL1, SSL2, and SSL3. The ground select transistor GST may be connected to a corresponding one of ground selection lines GSL1, GSL2, and GSL3. The dummy wordlines may also be adjacent to the ground selection lines GSL1, GSL2, and GSL3. The string select transistor SST may be connected to a corresponding one of the bit lines BL1, BL2, and BL3, and the ground select transistor GST may be connected to the common source line CSL.

Gate lines (for example, GTL1) on the same level may be commonly connected to one another, and the ground selection lines GSL1, GSL2, and GSL3 and the string selection lines SSL1, SSL2, and SSL3 may be separated from one another. Although the memory block BLKi is connected to the eight gate lines GTL1 to GTL8 and the three bit lines BL1, BL2, and BL3 in FIG. 4, the inventive concept is not limited thereto.

Referring to FIGS. 5 and 6, the memory block BLKi is formed in a vertical direction with respect to a substrate SUB. Memory cells that constitute the memory NAND strings NS11 to NS33 are stacked on a plurality of semiconductor layers.

Common source lines CSL each extending in a first direction (Y direction) are provided on the substrate SUB. On a portion of the substrate SUB between two adjacent common source lines CSL, a plurality of insulation layers IL each extending in the first direction (Y direction) may be provided sequentially in a third direction (Z direction), and the plurality of insulation layers IL may be spaced apart from one another by a specific distance in the third direction (Z direction). A plurality of pillars P sequentially arranged in the first direction (Y direction) and penetrating through the plurality of insulation layers IL in the third direction (Z direction) are provided on the portion of the substrate SUB between two adjacent common source lines CSL. The plurality of pillars P may penetrate through the plurality of insulation layers IL and contact the substrate SUB. A surface layer S of each of the plurality of pillars P may include a silicon material doped with impurities of a first conductive type, and may function as a channel region. An internal layer I of each of the plurality of pillars P may include an insulating material such as silicon oxide, or an air gap. On the portion of the substrate SUB between two adjacent common source lines CSL, a charge storage layer CS is provided along the insulation layers IL, the pillars P, and an exposed surface of the substrate SUB. The charge storage layer CS may include a gate insulation layer (or a tunneling insulation layer), a charge trapping layer, and a blocking insulation layer. On the portion of the substrate SUB between two adjacent common source lines CSL, a gate electrode GE such as the string and ground selection lines SLL and GSL and word lines WL1, WL2, WL3, WL4, WL5, WL6, WL7 and WL8 is provided on an exposed surface of the charge storage layer CS. Drains or drain contacts DR may be provided on the plurality of pillars P, respectively. The bit lines BL1 to BL3 each extending in the second direction (X direction) and spaced apart from one another by a specific distance in the first direction (Y direction) may be provided on the drain contacts DR.

As shown in FIG. 5, each of the memory NAND strings NS11 to NS33 may be implemented as a structure in which a first memory stack ST1 and a second memory stack ST2 are stacked in a third direction (Z direction). The first memory stack ST1 is connected to the common source line CSL, the second memory stack ST2 is connected to the bit lines BL1 to BL3, and the first memory stack ST1 and the second memory stack ST2 are stacked such that they may share different channel holes.

Referring to FIG. 6, a first NVM 110*a* may have a C2C structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu), a Cu-to-Cu bonding technique may be employed. The present embodiment, however, may not be limited thereto. For example, the bonding metals may also be formed of aluminum (Al) or tungsten (W).

Each of the peripheral circuit region PERI and the cell region CELL of the first NVM 110*a* may include an external pad bonding area PA, a word line bonding area WLBA, and a bit line bonding area BLBA.

The peripheral circuit region PERI may include a first substrate 210, an interlayer insulating layer 215, a plurality of circuit elements 220*a*, 220*b*, and 220*c* formed on the first substrate 210, first metal layers 230*a*, 230*b*, and 230*c* respectively connected to the plurality of circuit elements 220*a*, 220*b*, and 220*c*, and second metal layers 240*a*, 240*b*, and 240*c* formed on the first metal layers 230*a*, 230*b*, and 230*c*. In an embodiment of the inventive concept, the first metal layers 230*a*, 230*b*, and 230*c* may be formed of tungsten having relatively high electrical resistivity, and the second metal layers 240*a*, 240*b*, and 240*c* may be formed of copper having relatively low electrical resistivity.

In the embodiment illustrated in FIG. 6, although only the first metal layers 230*a*, 230*b*, and 230*c* and the second metal layers 240*a*, 240*b*, and 240*c* are shown and described, the inventive concept is not limited thereto, and one or more additional metal layers may be further formed on the second metal layers 240*a*, 240*b*, and 240*c*. At least a portion of the one or more additional metal layers formed on the second metal layers 240a, 240b, and 240c may be formed of aluminum or the like having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331, 332, 333, 334, 335, 336, 337 and 338 (e.g., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (a Z-axis direction), perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an embodiment of the inventive concept, the bit line 360c may extend in a first direction (a Y-axis direction), parallel to the upper surface of the second substrate 310.

In the embodiment illustrated in FIG. 6, an area in which the channel structure CH, the bit line 360c, and the like are disposed may be the bit line bonding area BLBA. In the bit line bonding area BLBA, the bit line 360c may be electrically connected to the circuit elements 220c providing a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341, 342, 343, 344, 345, 346 and 347 (e.g., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b forming a row decoder 394 in the peripheral circuit region PERI. In an embodiment of the inventive concept, operating voltages of the circuit elements 220b of the row decoder 394 may be different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be the external pad bonding area PA.

Input-output pads 205 and 305 may be disposed in the external pad bonding area PA. Referring to FIG. 6, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 6, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303. In the present embodiment, the second input-output pad 305 is electrically connected to the circuit element 220a.

According to embodiments of the inventive concept, the second substrate 310 and the common source line 320 may not be disposed in an area in which the second input-output contact plug 303 is disposed. In addition, the second input-output pad 305 may not overlap the word lines 330 in the third direction (the Z-axis direction). Referring to FIG. 6, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments of the inventive concept, the first input-output pad 205 and the second input-output pad 305 may be selectively formed. For example, the first NVM 110a may include only the first input-output pad 205 disposed on the first substrate 210 or the second input-output pad 305 disposed on the second substrate 310. Alternatively, the first NVM 110a may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the first NVM 110a may include a lower metal pattern 273a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PER, the lower metal pattern 273a formed in the uppermost metal layer of the peripheral circuit region PERI may not be connected to a contact. Similarly, in the external pad bonding area PA, the upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an embodiment of the inventive concept, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Figure 7:
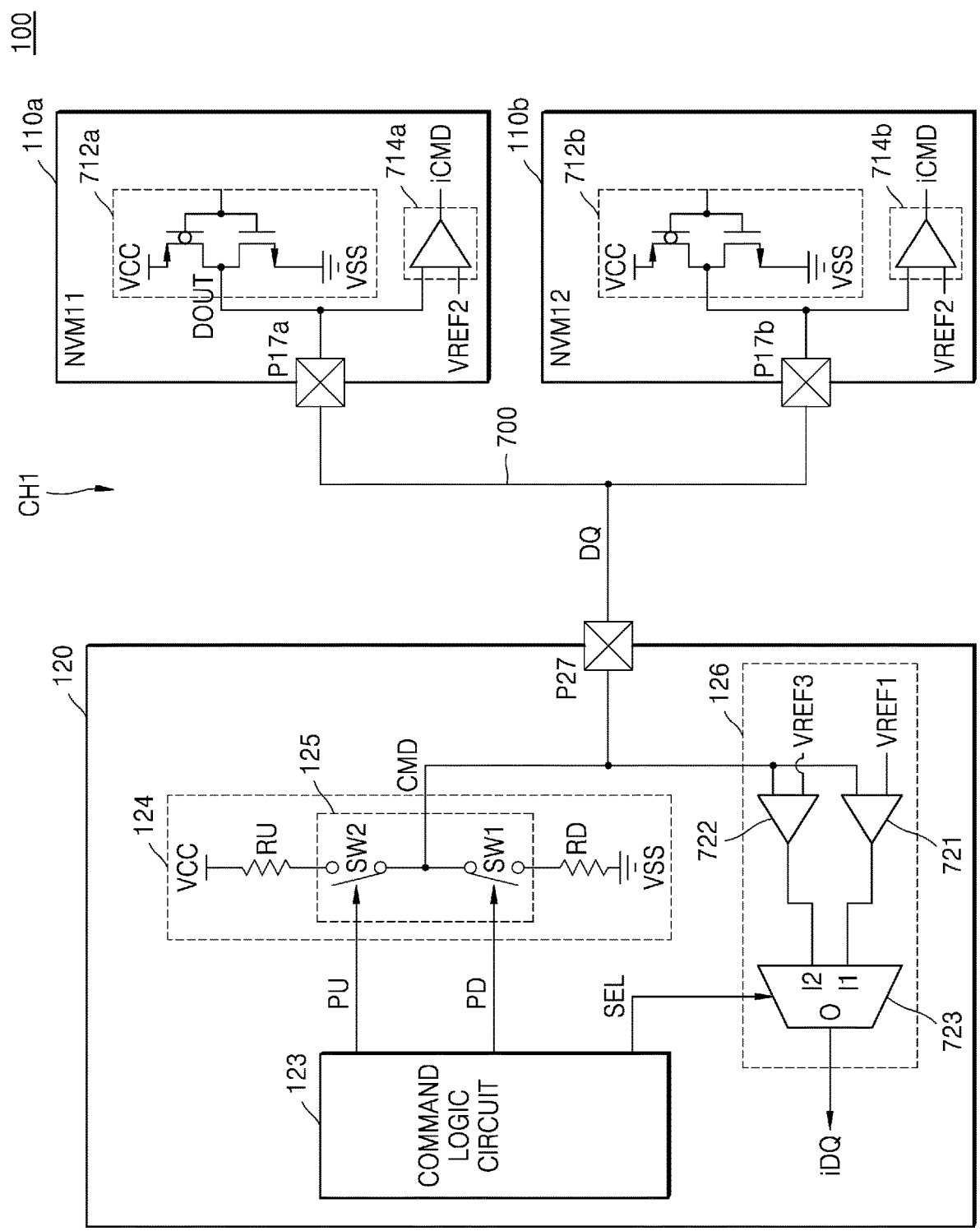
FIG. 7 is a circuit diagram of a storage device according to embodiments of the inventive concept.

FIG. 7 is a circuit diagram of a storage device 100 according to embodiments of the inventive concept. Hereinafter, subscripts (e.g., 'a' of 110a and 'b' of 110b) attached to reference numerals are used to distinguish a plurality of circuits having the same function. In the following embodiments, terms "data signal DQ and "DQ" may be used interchangeably for convenience.

Referring to FIGS. 2 and 7, the memory controller 120 may be connected to first and second NVMs 110a and 110b through a first channel CH1. In the present embodiment, a data signal DQ line 700 (hereinafter, referred to as "DQ line 700") among a plurality of signal lines of the first channel CH1 described with reference to FIG. 2 will be described. The DQ line 700 of the first channel CH1 may be connected in common to a DQ pin P27 of the memory controller 120, a DQ pad P17a of the first NVM 110a, and a DQ pad P17b of the second NVM 110b.

The first NVM 110a may include an output buffer 712a and an input buffer 714a each connected to the DQ pad P17a, and the second NVM 110b may include an output buffer 712b and an input buffer 714b each connected to the DQ pad P17b. The output buffers 712a and 712b and the input buffers 714a and 714b may be driven by a power voltage VCC and a ground voltage VSS.

Each of the first and second NVMs 110a and 110b may output data DOUT, which is output according to a read operation, to the DQ pads P17a and P17b through the output buffers 712a and 712b. Among the first and second NVMs 110a and 110b, the first NVM 110a receiving a read enable signal nRE from the memory controller 120 may output the output data DOUT to the DQ pad P17a and the DQ line 700 through the output buffer 712a. The memory controller 120 may receive the output data DOUT of the first NVM 110a transmitted to the DQ line 700.

The first and second NVMs 110a and 110b may receive a command CMD, which is provided from the memory controller 120 to the DQ line 700, through the DQ pads P17a and P17b and the input buffers 714a and 714b, respectively. The input buffers 714a and 714b may include a comparator for comparing the level of a signal applied to the DQ pads P17a and P17b with the level of a second reference voltage VREF2, and may obtain an internal command iCMD through the comparator. In other words, the comparator may output the internal command iCMD based on the comparison of the signal applied to the DQ pads P17a and P17b with the second reference voltage VREF2. According to an embodiment of the inventive concept, the second reference voltage VREF2 may be set to an intermediate voltage level between the power voltage VCC and the ground voltage VSS. Among the first and second NVMs 110a and 110b, the second NVM 110b receiving a write enable signal nWE and a command latch enable signal CLE from the memory controller 120 may receive the command CMD of the memory controller 120 through the DQ pad P17b and the input buffer 714b. The second NVM 110b may obtain an internal command iCMD corresponding to the command CMD of the memory controller 120.

The memory controller 120 may include a switch circuit 125 and a data extraction circuit 126 each connected to the DQ pin P27. The switch circuit 125 may be connected to the ODT circuit 124 in selective response to a pull-up signal PU and a pull-down signal PD each provided from the command logic circuit 123. When the command logic circuit 123 generates a command CMD to be provided to the first and second NVMs 110a and 110b, the command logic circuit 123 may generate a pull-up signal PU, a pull-down signal PD, and a selection signal SEL according to a signal bit value (hereinafter, referred to as a CMD signal bit) of the command CMD. The pull-up signal PU, the pull-down signal PD, and the selection signal SEL provided from the command logic circuit 123 may be referred to as control signals. The command logic circuit 123 may generate the pull-up signal PU when the CMD signal bit is logic '1', and generate the pull-down signal PD when the CMD signal bit is logic '0'. In addition, the command logic circuit 123 may generate the selection signal SEL at a logic high level when the CMD signal bit is logic '1', generate the selection signal SEL at a logic low level when the CMD signal bit is logic '0', and provide the selection signal SEL to the data extraction circuit 126.

The ODT circuit 124 may be provided to increase signal integrity by adjusting the swing widths and/or driving strengths of signals received through the DQ line 700. In general, as the swing widths of the signals decrease, an influence due to external noise increases, and signal reflection caused by impedance mismatch at interfaces worsens. To reduce the impedance mismatch, the memory controller 120 may perform an impedance adjustment operation of constantly adjusting a termination resistance by using the ODT circuit 124. Likewise, in the first and second NVMs 110a and 110b, termination resistances may be provided using the output buffers 712a and 712b, respectively. According to an embodiment of the inventive concept, the termination resistances of the output buffers 712a and 712b may be provided only to the power voltage VCC, thereby implementing a pseudo open drain (POD) level on the DQ line 700 to reduce the power consumption of the storage device 100. The ODT circuit 124 may include a pull-up resistor portion RU connected to the power voltage VCC and a pull-down resistor portion RD connected to the ground voltage VSS.

The switch circuit 125 may include a first switch SW1 and a second switch SW2, which are connected between the ODT circuit 124 and the DQ pin P27. The first switch SW1 may be connected between the DQ pin P27 and the pull-down resistor portion RD and may be turned on or off by the pull-down signal PD of the command logic circuit 123. The second switch SW2 may be connected between the pull-up resistor portion RU and the DQ pin P27 and may be turned on or off by the pull-up signal PU of the command logic circuit 123.

The data extraction circuit 126 may include a first comparator 721, a second comparator 722, and a selector 723. The first comparator 721 may compare the level of a signal applied to the DQ pin P27 with the level of a first reference voltage VREF1 and provide a result of the comparison as a first input 11 of the selector 723. The second comparator 722 may compare the level of the signal applied to the DQ pin P27 with the level of a third reference voltage VREF3 and provide a result of the comparison to a second input 12 of the selector 723. The level of the first reference voltage VREF1 may be set lower than the level of the second reference voltage VREF2, and the level of the third reference voltage VREF3 may be set higher than the level of the second reference voltage VREF2.

When the selection signal SEL is at a logic low level, the selector 723 may select the output of the first comparator 721 input to the first input 11 and output the selected output of the first comparator 721 as an internal data signal iDQ. When the selection signal SEL is at a logic high level, the selector 723 may select the output of the second comparator 722 input to the second input 12 and output the selected output of the second comparator 722 as the internal data signal iDQ.

Figure 8:
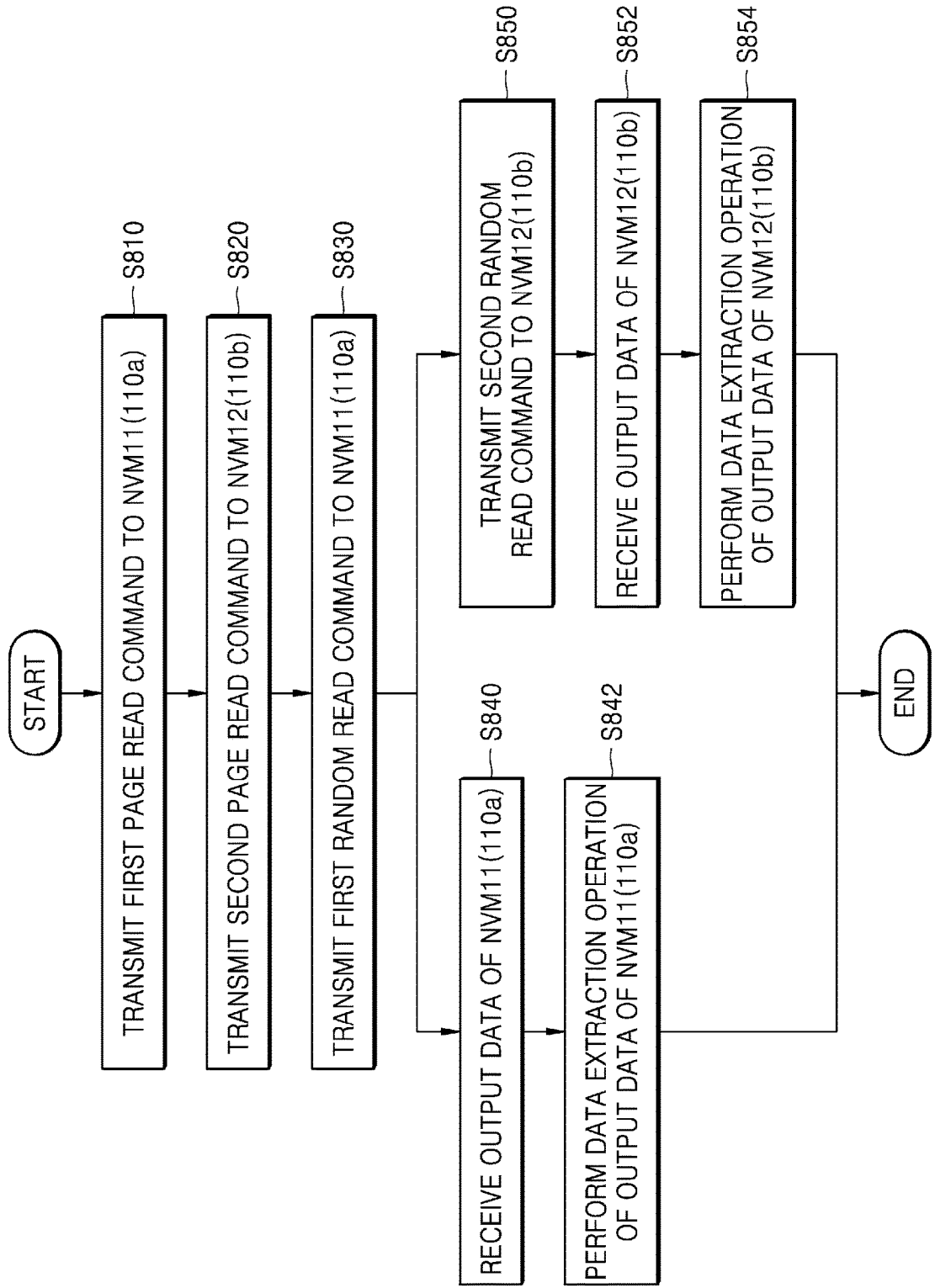
FIG. 8 is a flowchart illustrating a read method of a memory controller with respect to first and second NVMs sharing a data signal (DQ) line of a first channel in the storage device of FIG. 7.
Figure 9:
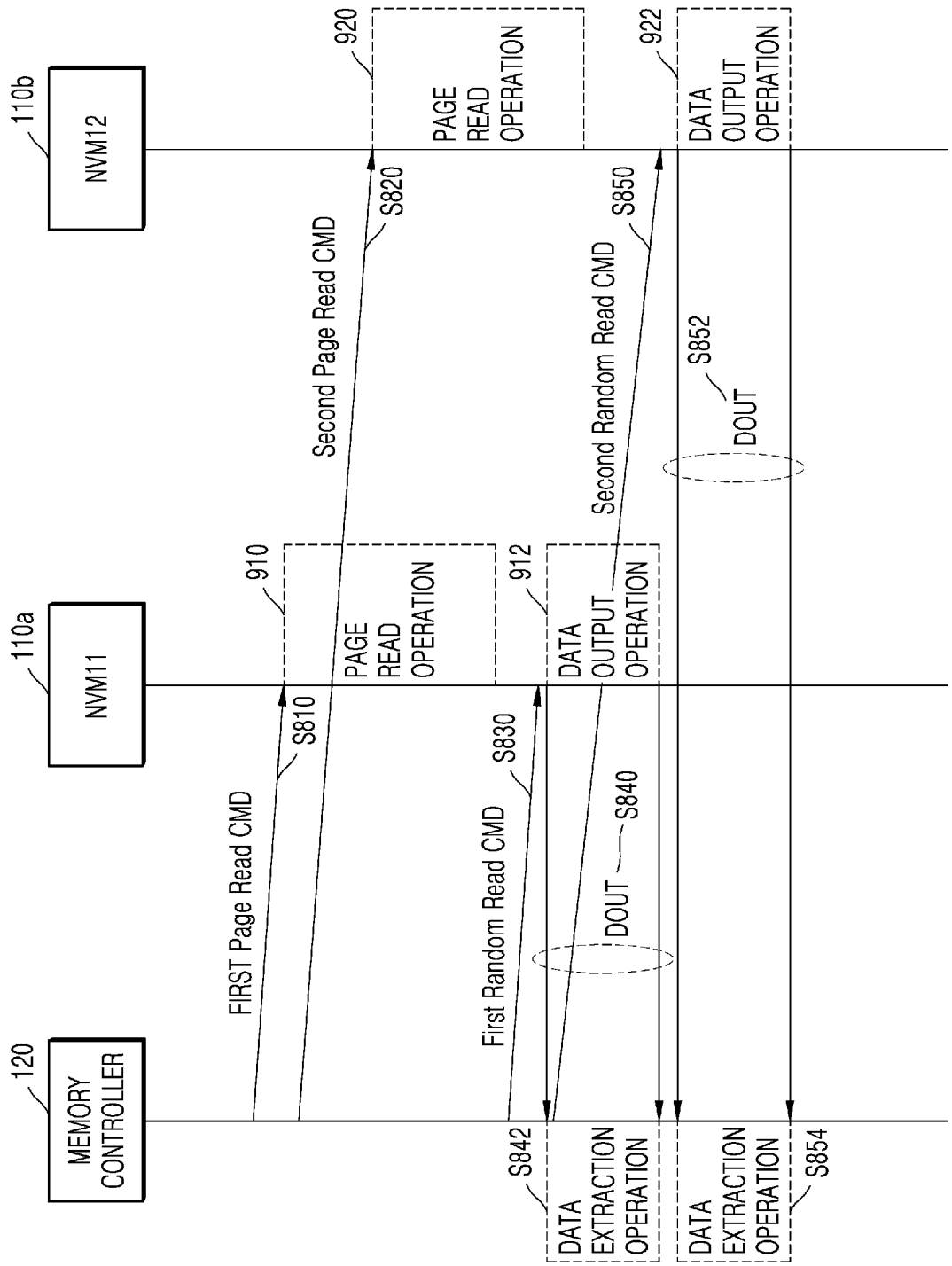
FIG. 9 is a diagram illustrating a read operation between a memory controller and first and second NVMs according to the read method of FIG. 8.
Figure 10:
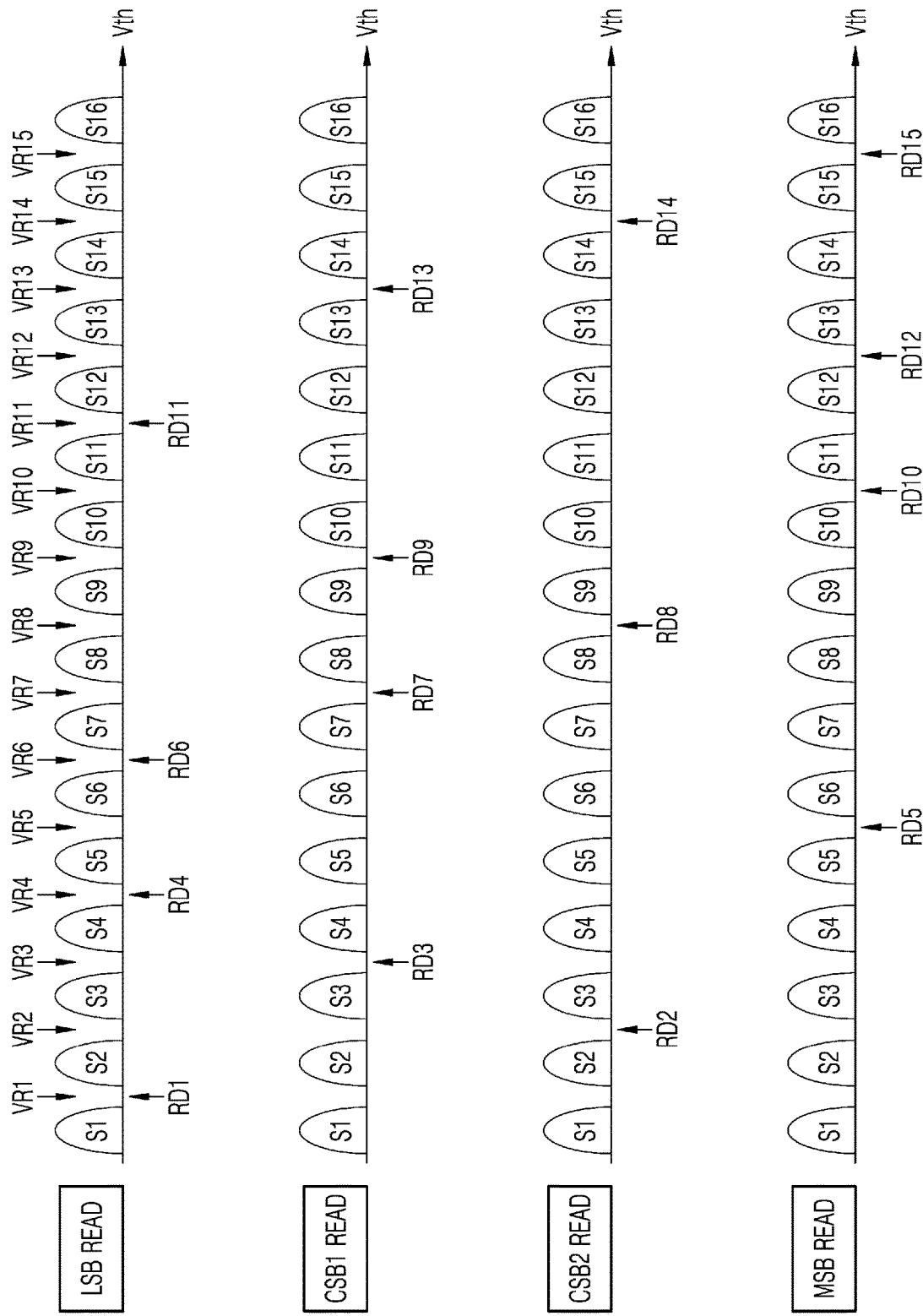
FIG. 10 is a chart showing a page read operation of the first and second NVMs of FIG. 9.

FIGS. 8 to 10 are diagrams illustrating a method of operating a storage device, according to embodiments of the inventive concept. FIG. 8 is a flowchart illustrating a read method of the memory controller 120 with respect to the first and second NVMs 110a and 110b sharing the DQ line 700 of the first channel CH1 in the storage device 100 of FIG. 7. FIG. 9 is a diagram illustrating a read operation between the memory controller 120 and the first and second NVMs 110a and 110b according to the read method of FIG. 8. In FIGS. 8 and 9, the read operation by the memory controller 120 may include a page read operation according to a page read command, and a data output operation of transmitting data, which is page-read by a page read operation according to a random read command, as output data DOUT to the memory controller 120. FIG. 10 is a chart showing a page read operation of the first and second NVMs 110a and 110b.

Referring to FIGS. 7, 8, and 9, in operation S810, the memory controller 120 may transmit a first page read command to the first NVM 110a. The memory controller 120 may transmit a first address to the first NVM 110a in addition to the first page read command. The first NVM 110a may perform a page read operation 910 on memory cells corresponding to the first address in the memory cell array 116 (see FIG. 3) in response to the first page read command.

One or more bits may be programmed to a memory cell in the memory cell array 116 of the first NVM 110a. A memory cell may be a single level cell (SLC), a multi-level cell (MLC), a triple level cell (TLC), or a quad level cell (QLC) according to the number of bits stored in the memory cell. A memory cell may have a plurality of states according to the number of bits stored in the memory cell. Each of the plurality of states may be a range of a threshold voltage. For example, when each of the memory cells is a QLC, a state of each of the memory cells may correspond to one of the sixteen states S1 to S16, as shown in FIG. 10. Memory cells connected to one word line WL may include a least significant bit (LSB) page, a first central significant bit (CSB1) page, a second central significant bit (CSB2) page, and a most significant bit (MSB) page.

The page read operation 910 of the first NVM 110a may include an operation of searching for valley locations VR1 to VR15 of the threshold voltages of memory cells, an operation of inferring optimal read voltages RD1 to RD15, based on the valley locations VR1 to VR15, and a page read operation with respect to each of the LSB page, the CSB1 page, the CSB2 page, and the MSB page by using the optimal read voltages RD1 to RD15. The valley location VR1 may be located between states S1 and S2 and the valley location VR15 may be located between states S15 and S16.

For example, in a read operation with respect to the LSB page, the memory device 110 may identify the eleventh and twelfth states S11 and S12 by applying the eleventh read voltage RD11 to the selection word line WL, and then may identify the sixth and seventh states S6 and S7, the fourth and fifth states S4 and S5, and the first and second states S1 and S2 by sequentially applying the sixth read voltage RD6, the fourth read voltage RD4, and the first read voltage RD1 to the selection word line WL. In a read operation with respect to the CSB1 page, the memory device 110 may identify the thirteenth and fourteenth states S13 and S14, the ninth and tenth states S9 and S10, the seventh and eighth states S7 and S8, and the third and fourth states S3 and S4 by sequentially applying the thirteenth read voltage RD13, the ninth read voltage RD9, the seventh read voltage RD7, and the third read voltage RD3 to the selection word line WL. In a read operation with respect to the CSB2 page, the memory device 110 may identify the fourteenth and fifteenth states S14 and S15, the eighth and ninth states S8 and S9, and the second and third states S2 and S3 by sequentially applying the fourteenth read voltage RD14, the eighth read voltage RD8, and the second read voltage RD2 to the selection word line WL. In a read operation with respect to the MSB page, the memory device 110 may identify the fifteenth and sixteenth states S15 and S16, the twelfth and thirteenth states S12 and S13, the tenth and eleventh states S10 and S11, and the fifth and sixth states S5 and S6 by applying the fifteenth read voltage RD15, the twelfth read voltage RD12, the tenth read voltage RD10, and the fifth read voltage RD5 to the selection word line WL.

In operation S820, the memory controller 120 may transmit a second page read command to the second NVM 110b. The memory controller 120 may transmit a second address to the second NVM 110b in addition to the second page read command. The second NVM 110b may perform a page read operation 920 on memory cells corresponding to the second address in the memory cell array 116 in response to the second page read command. The page read operation 920 of the second NVM 110b, as described with reference to FIG. 10, may include an operation of searching for valley locations VR1 to VR15 of the threshold voltages of memory cells, an operation of inferring optimal read voltages RD1 to RD15, based on the valley locations VR1 to VR15, and a page read operation with respect to each of the LSB page, the CSB1 page, the CSB2 page, and the MSB page by using the optimal read voltages RD1 to RD15.

In operation S830, the memory controller 120 may transmit a first random read command to the first NVM 110a. The memory controller 120 may transmit a third address to the first NVM 110a in addition to the first random read command. The third address may be set to address all or some of the memory cells corresponding to the first address of the first NVM 110a. The first NVM 110a may perform a data output operation 912 of selecting all or part of data, which is page-read according to the first page read command in response to the first random read command and the third address, and outputting the output data DOUT of the first NVM 110a. According to the data output operation 912, the output data DOUT of the first NVM 110a may be transmitted to the DQ pad P17a and the DQ line 700 through the output buffer 712a.

In operation S840, the memory controller 120 may receive, through the DQ line 700, the output data DOUT output from the first NVM 110a according to the first page read command and the first random read command.

In operation S842, the memory controller 120 may perform a data extraction operation on the output data DOUT of the first NVM 110a received through the DQ line 700 and the DQ pin P27. In the data extraction operation, an internal data signal iDQ corresponding to the output data DOUT of the first NVM 110a may be obtained using the data extraction circuit 126. The data extraction circuit 126 may obtain the internal data signal iDQ by selectively outputting the output of the first comparator 721 and the output of the second comparator 722 based on the selection signal SEL applied to the selector 723. The first comparator 721 may obtain the output thereof by comparing the voltage level of the output data DOUT applied to the DQ pin P27 with the level of the first reference voltage VREF1, and the second comparator 722 may obtain the output thereof by comparing the voltage level of the output data DOUT with the level of the third reference voltage VREF3.

While receiving the output data DOUT through the DQ line 700 in operation S840, the memory controller 120 may perform operation S850 in which a second random read command for the second NVM 110b is transmitted to the second NVM 110b through the DQ line 700.

In operation S850, the memory controller 120 may transmit the second random read command to the second NVM 110b. The memory controller 120 may transmit a fourth address to the second NVM 110b in addition to the second random read command. The fourth address may be set to address all or some of the memory cells corresponding to the second address of the second NVM 110b. The second NVM 110b may perform a data output operation 922 of selecting all or part of data, which is page-read according to the second page read command in response to the second random read command and the fourth address, and outputting the output data DOUT of the first second NVM 110b. According to the data output operation 922, the output data DOUT of the second NVM 110b may be transmitted to the DQ pad P17b and the DQ line 700 through the output buffer 712b.

In operation S852, the memory controller 120 may receive, through the DQ line 700, the output data DOUT output from the second NVM 110b according to the second page read command and the second random read command.

In operation S854, the memory controller 120 may perform a data extraction operation on the output data DOUT of the second NVM 110b received through the DQ line 700 and the DQ pin P27. In the data extraction operation, an internal data signal iDQ corresponding to the output data DOUT of the second NVM 110b may be obtained using the data extraction circuit 126.

Figure 11:
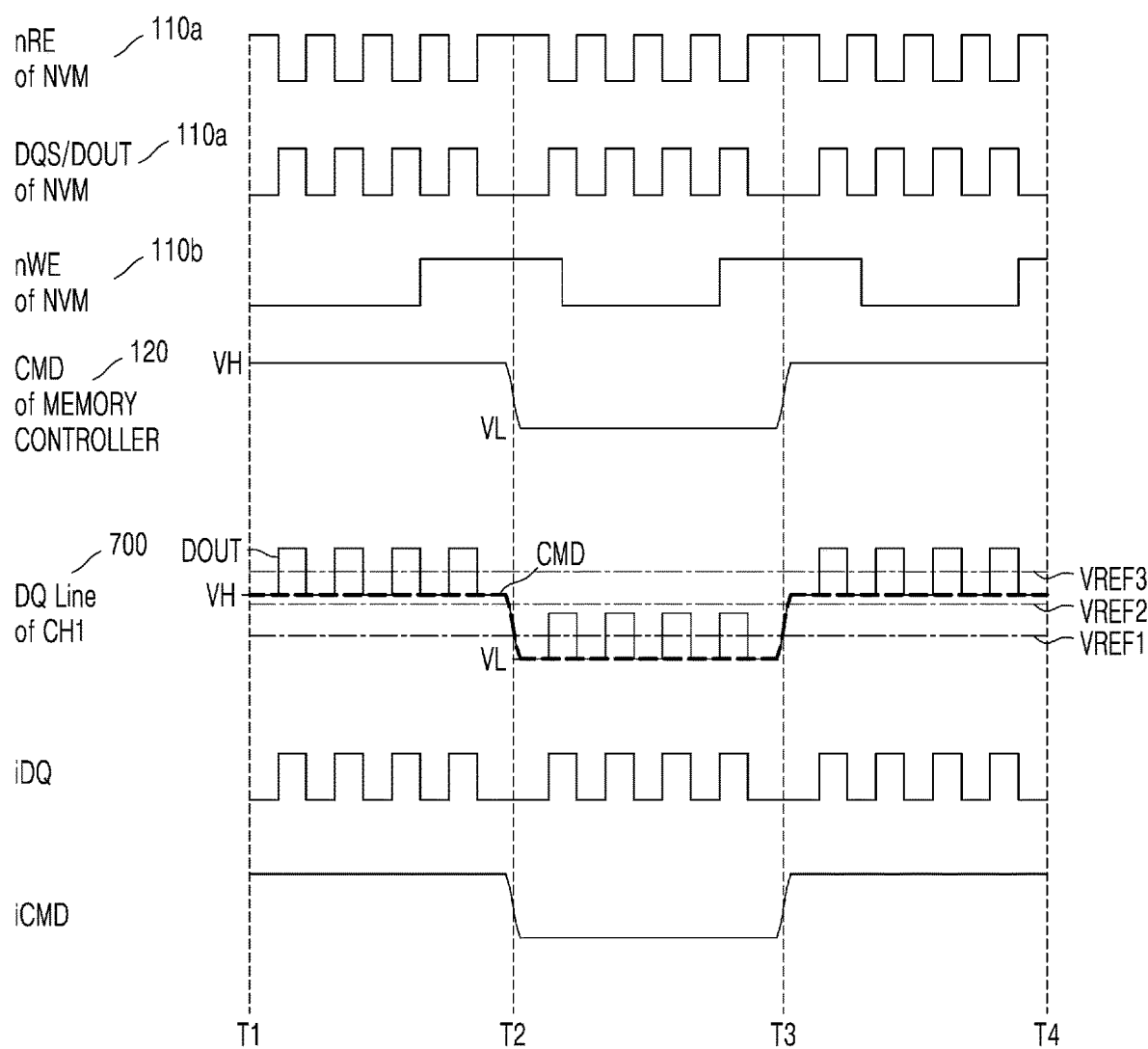
FIG. 11 is a timing diagram illustrating data and commands transmitted to a DQ line of a first channel in the storage device of FIG. 7.

FIG. 11 is a timing diagram illustrating data and commands transmitted to the DQ line 700 of the first channel CH1 in the storage device 100 of FIG. 7. It should be noted that in the timing diagram described below, the horizontal axis and the vertical axis represent time and a voltage level, respectively, and are not drawn to scale.

Referring to FIGS. 2, 7 and 11, to perform a read operation, the first NVM 110a may receive a read enable signal nRE from the memory controller 120 through the first channel CH1 at time T1. The first NVM 110a may generate a data strobe signal DQS according to the read enable signal nRE. The first NVM 110a may output data, which is page-read by a page read operation, as the output data DOUT. The output data DOUT may be transmitted to the memory controller 120 together with the data strobe signal DQS. The first NVM 110a may transmit the output data DOUT output by the read operation to the DQ line 700 of the first channel CH1 through the DQ pad P17a.

At time T1, the second NVM 110b may receive a write enable signal nWE through the first channel CH1 to receive a command CMD from the memory controller 120. The memory controller 120 may transmit a command CMD having a high voltage level VH to the DQ line 700 of the first channel CH1 through the DQ pin P27 by using the second switch SW2 turned on by the pull-up signal PU of the command logic circuit 123. The command of the high voltage level VH may be output at time T1. The high voltage level VH indicates that the CMD signal bit is logic "1", and may be set higher than the level of the second reference voltage VREF2. Accordingly, the level of the DQ line 700 of the first channel CH1 may be changed to the high voltage level VH of the command CMD.

Output data DOUT output by a read operation of the first NVM 110a may be loaded on the DQ line 700 of the first channel CH1, and a command CMD transmitted to the second NVM 110b may be loaded on the DQ line 700. In other words, both the output data DOUT and the command CMD are loaded on the first channel CH1 at the same time. For example, the command CMD transmitted to the second NVM 110b may have a relatively lower transmission rate than the output data DOUT of the first NVM 110a. For example, the transmission rate of the command CMD may be set to about ¼ of the transmission rate of the output data DOUT. Accordingly, a command CMD having a low frequency may be embedded in output data DOUT having a high frequency.

The memory controller 120 may receive, through the DQ pin P27, the output data DOUT of the first NVM 110a transmitted to the DQ line 700 of the first channel CH1, and may obtain an internal data signal iDQ corresponding to the output data DOUT of the first NVM 110*a* by using the data extraction circuit 126.

From time T1 to time T2, the output data DOUT of the first NVM 110*a* may be loaded on the DQ line 700 of the first channel CH1 at a high voltage level (VH) state of the command CMD. The memory controller 120 may select the output of the second comparator 722 based on a selection signal SEL having a logic high level, which is generated by the command logic circuit 123, and obtain the selected output of the second comparator 722 as an internal data signal iDQ. In this case, the second comparator 722 compares the voltage level of the output data DOUT applied to the DQ pin P27 with the level of the third reference voltage VREF3 to produce the internal data signal iDQ. The internal data signal iDQ may correspond to the output data DOUT of the first NVM 110*a*. The second NVM 110*b* may generate, as the internal command iCMD, an output of the input buffer 714*b*, the output of the input buffer 714*b* being obtained by comparing a command CMD applied to the DQ pad P17*b* with the level of the second reference voltage VREF2. The internal command iCMD may correspond to a CMD signal logic '1' bit of the memory controller 120.

At time T2, the memory controller 120 may transmit a command CMD having a low voltage level VL to the DQ line 700 of the first channel CH1 through the DQ pin P27 by using the first switch SW1 turned on by the pull-down signal PD of the command logic circuit 123. The low voltage level VL indicates that the CMD signal bit is logic "0", and may be set lower than the level of the second reference voltage VREF2. Accordingly, the level of the DQ line 700 of the first channel CH1 may be changed to the low voltage level V L of the command CMD. In other words, from time T1 to time T2, the level of the DQ line 700 of the first channel CH1 may correspond to the high voltage level VM and from time T2 to T3, the level of the DQ line 700 of the first channel CH1 may correspond to the low voltage level VL.

From time T2 to time T3, the output data DOUT of the first NVM 110*a* may be loaded on the DQ line 700 of the first channel CH1 in a low voltage level (VL) state of the command CMD. The memory controller 120 may select the output of the first comparator 721 based on a selection signal SEL having a logic low level, which is generated by the command logic circuit 123, and obtain the selected output of the first comparator 721 as an internal data signal iDQ. In this case, the first comparator 721 compares the voltage level of the output data DOUT applied to the DQ pin P27 with the level of the first reference voltage VREF1 to produce the internal data signal iDQ. The internal data signal iDQ may correspond to the output data DOUT of the first NVM 110*a*. The second NVM 110*b* may generate, as the internal command iCMD, an output of the input buffer 714*b* by comparing the low voltage level VL of a command CMD applied to the DQ pad P17*b* with the level of the second reference voltage VREF2. The internal command iCMD may correspond to a CMD signal logic '0' bit of the memory controller 120.

At time T3, when the CMD signal bit is logic '1', the memory controller 120 may transmit a command CMD having the high voltage level VH by the command logic circuit 123, the ODT circuit 124, and the switch circuit 125 to the DQ line 700 of the first channel CH1 through the DQ pin P27.

From time T3 to time T4, the output data DOUT of the first NVM 110*a* may be loaded on the DQ line 700 of the first channel CH1 in a high voltage level (VH) state of the command CMD. The memory controller 120 may select the output of the second comparator 722 based on a selection signal SEL having a logic high level, which is generated by the command logic circuit 123, and obtain the selected output of the second comparator 722 as an internal data signal iDQ. Here, the second comparator 722 compares the voltage level of the output data DOUT applied to the DQ pin P27 with the level of the third reference voltage VREF3 to obtain the internal data signal iDQ. The second NVM 110*b* may generate, as the internal command iCMD, an output of the input buffer 714*b* by comparing a command CMD applied to the DQ pad P17*b* with the level of the second reference voltage VREF2.

In FIGS. 7 to 11, the output data DOUT output from the first NVM 110*a* and the command CMD transmitted to the second NVM 110*b* may be transmitted in both directions of the DQ line 700 of the first channel CH1. In other words, the output data DOUT and the command CMD may be present on the DQ line 700 of the first channel CH1 at the same time while being transmitted in different directions. More specifically, the voltage level of the DQ line 700 of the first channel CH1 may be changed based on the command CMD for the second NVM 110*b*, and the output data DOUT of the first NVM 110*a* may be loaded on the DQ line 700 of the first channel CH1 having the changed voltage level. According to another embodiment of the inventive concept, the address ADDR of the second NVM 110*b* may be transmitted to the DQ line 700 of the first channel CH1 instead of the command CMD of the second NVM 110*b*. Accordingly, the voltage level of the DQ line 700 of the first channel CH1 may be changed based on an address ADDR of the second NVM 110*b*, and the output data DOUT of the first NVM 110*a* may be loaded on the DQ line 700 of the first channel CH1 having the changed voltage level. In this case, the address ADDR of the second NVM 110*b* may have the high voltage level VH and the output data DOUT of the first NVM 110*a* may be loaded on the DQ line 700 of the high voltage level changed by the address ADDR of the second NVM 110*b*. The output data DOUT of the first NVM 110*a* and the address ADDR of the second NVM 110*b* may be transmitted in both directions of the DQ line 700 of the first channel CH1.

Figure 12:
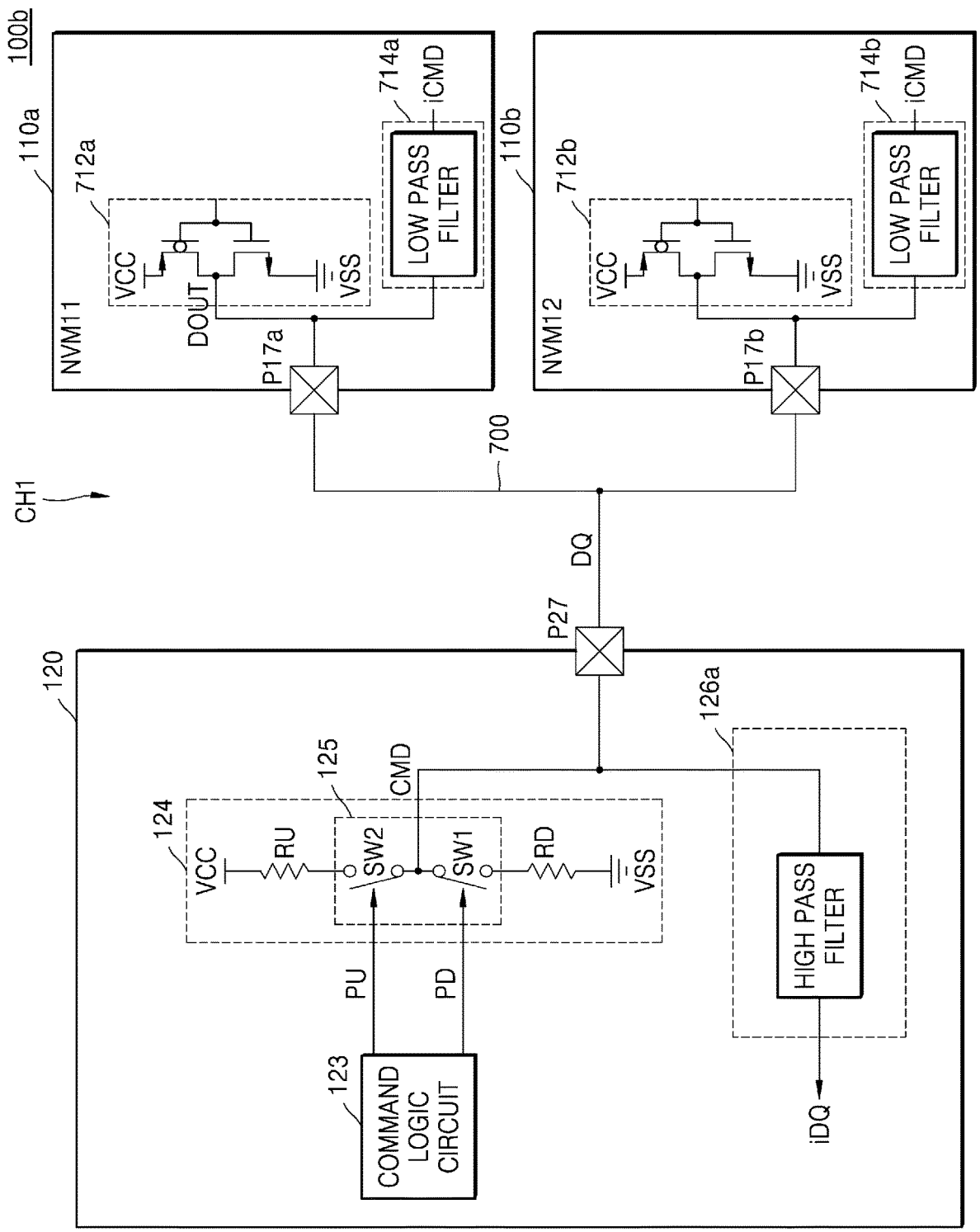
FIG. 12 is a circuit diagram of a storage device according to embodiments of the inventive concept.

FIG. 12 is a circuit diagram of a storage device 100*b* according to embodiments of the inventive concept. The storage device 100*b* of FIG. 12 is different from the storage device 100 of FIG. 7 in that a data extraction circuit 126*a* of a memory controller 120 is configured as a high pass filter and input buffers 714*a* and 714*b* of first and second NVMs 110*a* and 110*b* are configured as low-pass filters. Hereinafter, descriptions of the storage device 100*b* that are redundant with those of the storage device 100 of FIG. 7 may be omitted.

Referring to FIGS. 11 and 12, the data extraction circuit 126*a* may receive high frequency components of signals received through a DQ line 700 and a DQ pin P27 and generate internal data iDQ. The data extraction circuit 126*a* may obtain internal data iDQ by filtering, by using a high pass filter, high-frequency output data DOUT output from the first NVM 110*a*. The input buffers 714*a* and 714*b* of the first and second NVMs 110*a* and 110*b* may respectively receive low frequency components of signals received through the DQ line 700 and DQ pads P17*a* and P17*b* and obtain an internal command iCMD. The input buffer 714*b* of the second NVM 110*b* may obtain the internal command iCMD by filtering a low-frequency command CMD of the memory controller 120 by using a low pass filter.

Figure 13:
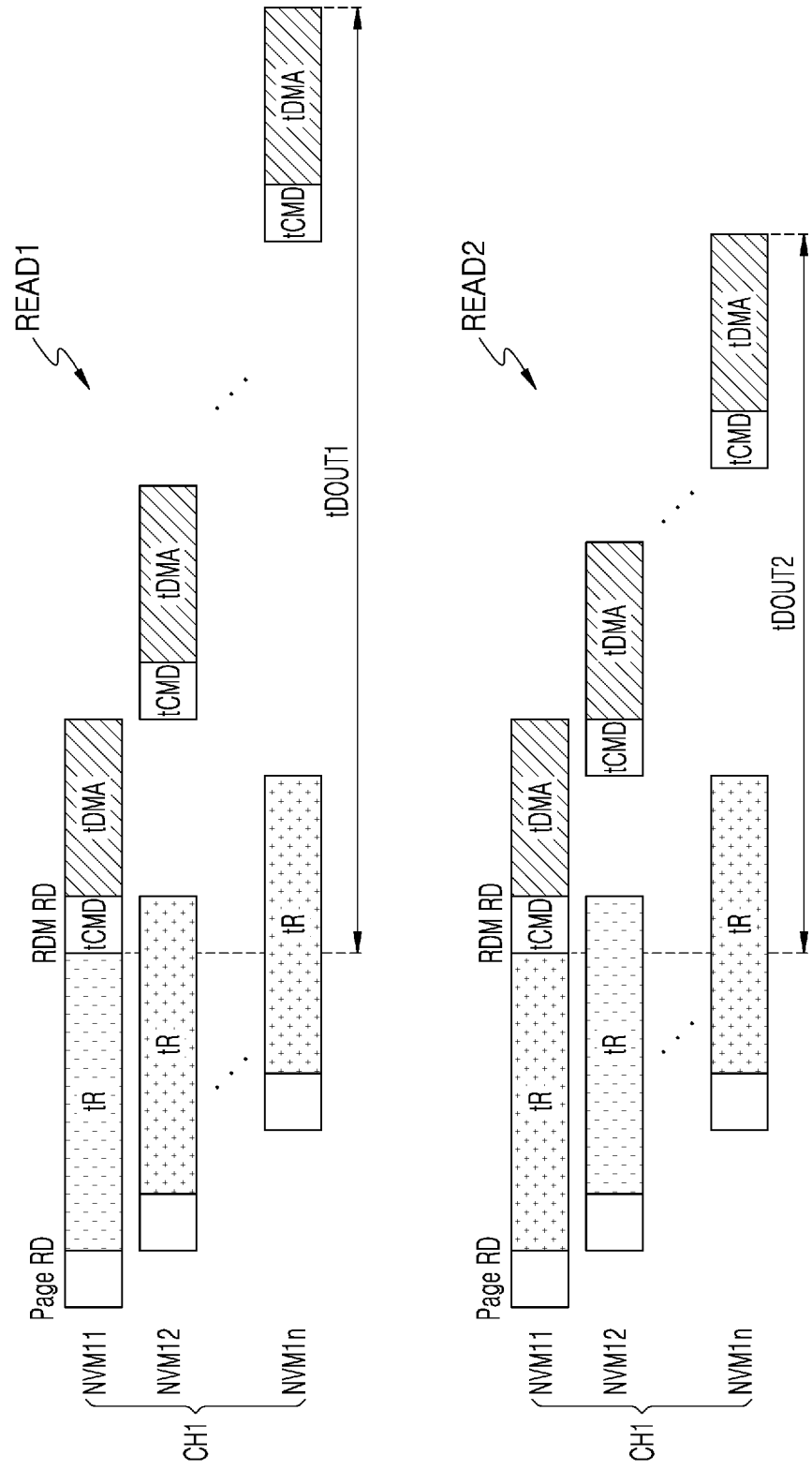
FIG. 13 is a diagram illustrating a read operation of a storage device according to embodiments of the inventive concept.

FIG. 13 is a diagram illustrating a read operation of a storage device according to embodiments of the inventive concept.

Referring to FIGS. 1 and 13, a read operation for the first channel CH1 of the storage device 100 may be sequentially performed on the non-volatile memory devices NVM11 to NVM1n. The memory controller 120 may transmit a page read command PAGE RD and a random read command RDM RD to each of the non-volatile memory devices NVM11 to NVM1n. For example, the page read command PAGE RD and the random read command RDM RD may be transmitted to the non-volatile memory device NVM11 and then to the non-volatile memory device NVM12. The random read command RDM RD may be transmitted after a time tR for which each of the non-volatile memory devices NVM11 to NVM1n performs a page read operation in response to the page read command PAGE RD. Each of the non-volatile memory devices NVM11 to NVM1n may perform a data output operation in response to the random read command RDM RD.

In a first read operation READ1, the random read command RDM RD may be transmitted to the non-volatile memory device NVM12 after a time tDMA in which the non-volatile memory device NVM11 performs a data output operation in response to the random read command RDM RD, and then, the non-volatile memory device NVM12 may perform a data output operation in response to the random read command RDM RD. In the first read operation READ1, data output to the memory controller 120 takes a time tDOUT1, which corresponds to the sum of an application time tCMD of the random read command RDM RD for each of the non-volatile memory devices NVM11 to NVM1n and the time tDMA for performing the data output operation. In the first read operation READ1, the data output operation of the non-volatile memory device NVM12 occurs after the data output operation of the non-volatile memory device NVM11.

In comparison, a second read operation READ2 in which a random read command for the non-volatile memory device NVM12 is transmitted may be performed during the time tDMA for which the non-volatile memory device NVM11 described with reference to FIGS. 7 to 12 performs a data output operation. In other words, the time in which the random read command for the non-volatile memory device NVM12 is transmitted may overlap with the data output operation of the non-volatile memory device NVM11. In the second read operation READ2, data output to the memory controller 120 takes a time tDOUT2, which corresponds to the sum of an application time tCMD of one random read command RDM RD to the non-volatile memory device NVM11 and a time tDMA for performing the data output operation of each of the non-volatile memory devices NVM11 to NVM1n. The time tDOUT2 is considerably shorter than the time tDOUT1. While in the second read operation READ2 the memory controller 120 receives high-frequency output data of a selected non-volatile memory device among the non-volatile memory devices NVM11 to NVM1n, the memory controller 120 may transmit a low frequency command to another non-volatile memory device among the non-volatile memory devices NVM11 to NVM1n, and thus, data input/output efficiency and data transmission speed may be increased.

Figure 14:
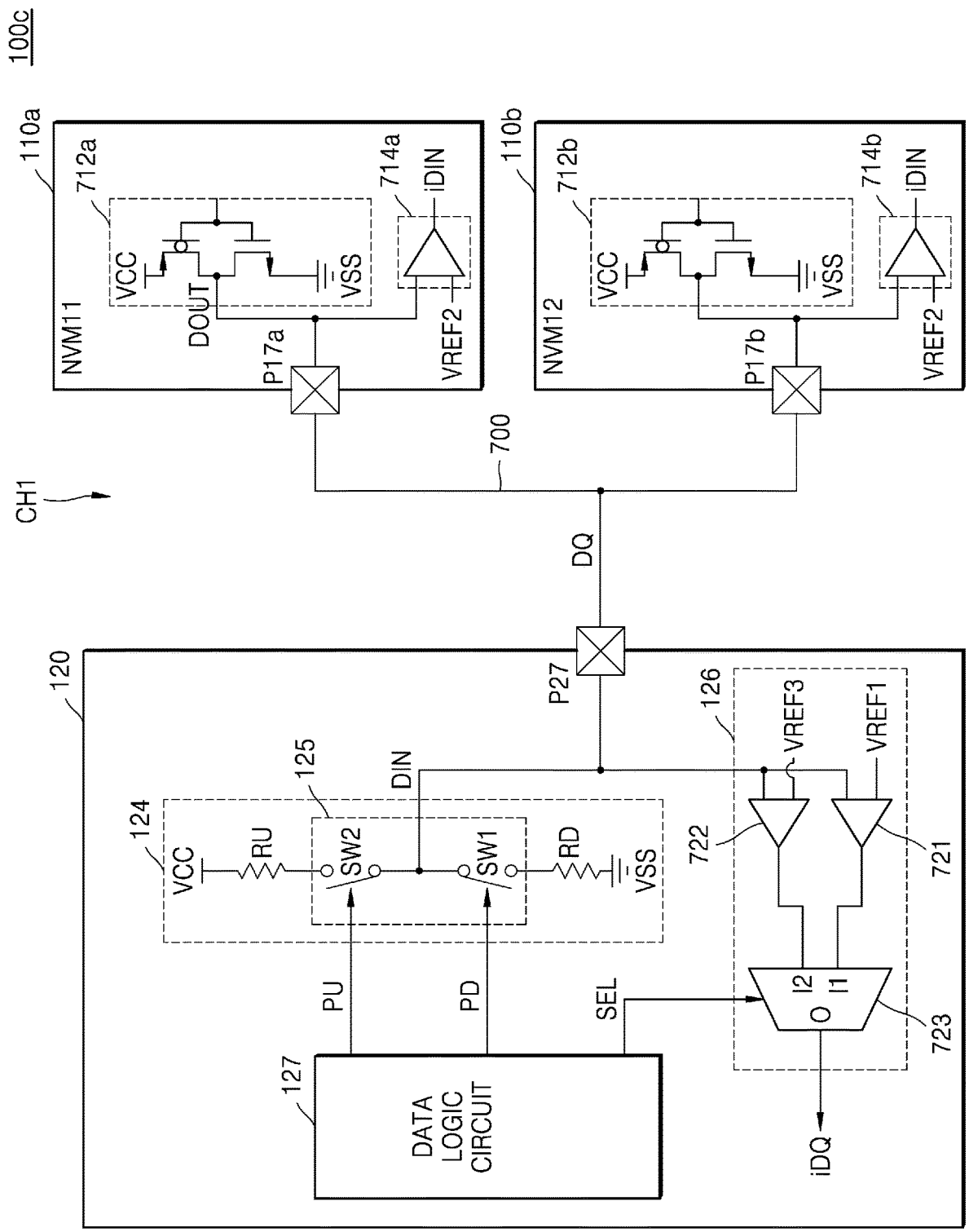
FIGS. 14 and 15 are diagrams illustrating a storage device according to embodiments of the inventive concept.
Figure 15:
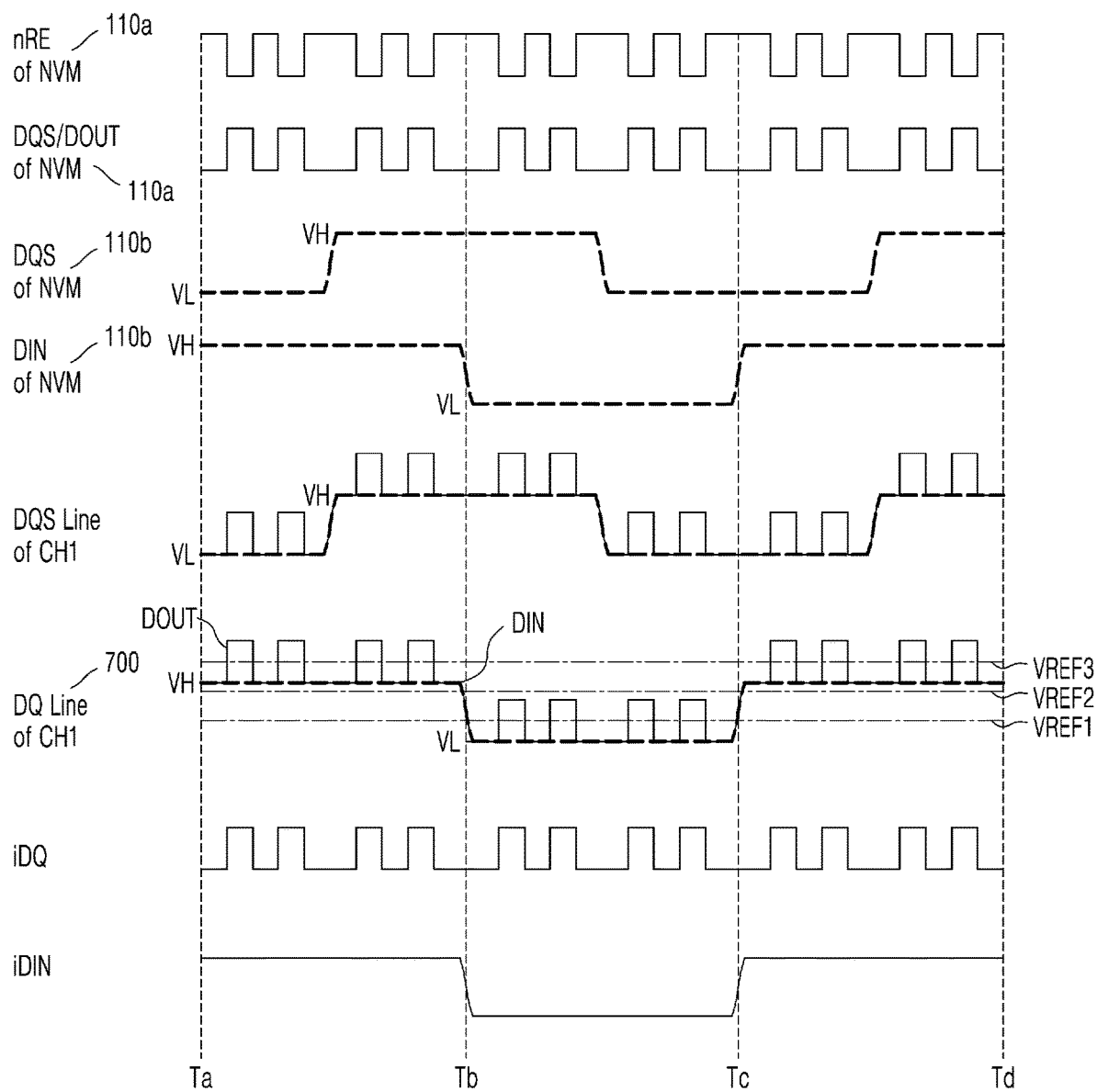

FIGS. 14 and 15 are diagrams illustrating a storage device 100c according to embodiments of the inventive concept. A circuit diagram of the storage device 100c of FIG. 14 is different from that of the storage device 100 of FIG. 7 in that a memory controller 120 includes a data logic circuit 127 instead of the command logic circuit 123. A timing diagram of FIG. 15 is different from that of FIG. 11 in that write data DIN input according to a write operation for a second NVM 110b, instead of the command CMD that is transmitted to the second NVM 110b in FIG. 11, is loaded on a DQ line 700 of a first channel CH1. Hereinafter, descriptions of the storage device 100a that are redundant with those of the storage device 100 of FIG. 7 may be omitted.

Referring to FIG. 14, the data logic circuit 127 may generate a pull-up signal PU, a pull-down signal PD, and a selection signal SEL according to a bit value (hereinafter, referred to as a DIN bit) of the write data DIN when providing the write data DIN to the second NVM 110b. The data logic circuit 127 may generate the pull-up signal PU when the DIN bit is logic '1', generate the pull-down signal PD when the DIN bit is logic '0', and provide the pull-up signal PU and the pull-down signal PD to a switch circuit 125. In addition, the data logic circuit 127 may generate a selection signal SEL at a logic high level when the DIN bit is logic '1', generate the selection signal SEL at a logic low level when the DIN bit is logic '0', and provide the selection signal SEL to a data extraction circuit 126.

The second NVM 110b may receive, through a DQ pad P17b and an input buffer 714b, the write data DIN provided from the memory controller 120 to the DQ line 700. The input buffer 714b may compare the write data DIN applied to the DQ pad P17b with the level of a second reference voltage VREF2 and obtain internal write data iDIN as a result of the comparison. The input buffer 714a may function similarly to the input buffer 714b. The second NVM 110b may obtain internal write data iDIN corresponding to the write data DIN of the memory controller 120.

Referring to FIG. 15, to perform a read operation, a first NVM 110a may receive a read enable signal nRE from the memory controller 120 through the first channel CH1 at time Ta, and may generate a data strobe signal DQS according to the read enable signal nRE. The data strobe signal DQS generated by the first NVM 110a may be transmitted to a DQS line of the first channel CH1. The first NVM 110a may transmit output data DOUT output by a read operation to the DQ line 700 of the first channel CH1 through the DQ pad P17a. The memory controller 120 may transmit a data strobe signal DQS associated with write data DIN for the second NVM 110b to the second NVM 110b through the DQS line of the first channel CH1. A data strobe signal DQS generated by the first NVM 110a and a data strobe signal DQS for the second NVM 110b generated by the memory controller 120 may be transmitted through the DQS line of the first channel CH1. A data strobe signal DQS generated by the first NVM 110a may be loaded on the DQS line of the first channel CH1 at the level of a data strobe signal DQS transmitted to the second NVM 110b. For example, from time ta to time tb, the data strobe signal DQS generated by the first NVM 110a may be loaded on the DQS line of the first channel CH1 at the first level and then the second level. The second NVM 110b may receive a data strobe signal DQS through the first channel CH1 to receive the write data DIN from the memory controller 120. The memory controller 120 may transmit write data DIN having a high voltage level VH to the DQ line 700 of the first channel CH1 through the DQ pin P27 by using a second switch SW2 turned on by the pull-up signal PU of the data logic circuit 127. The high voltage level VH indicates that the DIN bit is logic '1', and may be set higher than the level of the second reference voltage VREF2. Accordingly, the level of the DQ line 700 of the first channel CH1 may be changed to the high voltage level VH of the write data DIN.

Output data DOUT output by a read operation of the first NVM 110a may be loaded on the DQ line 700 of the first channel CH1, and write data DIN transmitted to the second NVM 110b may be loaded on the DQ line 700. For example, the write data DIN transmitted to the second NVM 110b may have a relatively lower transmission rate than the output data DOUT of the first NVM 110a. For example, the transmission rate of the write data DIN may be set to about ¼ of the transmission rate of the output data DOUT. Accordingly, write data DIN having a low frequency may be embedded in output data DOUT having a high frequency.

From time Ta to time Tb, the output data DOUT of the first NVM 110a may be loaded on the DQ line 700 of the first channel CH1 in a high voltage level (VH) state of the write data DIN. The memory controller 120 may select the output of the second comparator 722 based on a selection signal SEL having a logic high level, which is generated by the data logic circuit 127, and obtain the selected output of the second comparator 722 as an internal data signal iDQ. Here, the second comparator 722 compares the voltage level of the output data DOUT applied to the DQ pin P27 with the level of the third reference voltage VREF3 to output the internal data signal iDQ. The second NVM 110b may generate, as an internal data signal iDQ, an output of the input buffer 714b by comparing write data DIN applied to the DQ pad P17b with the level of the second reference voltage VREF2.

At time Tb, the memory controller 120 may transmit write data DIN having a low voltage level VL to the DQ line 700 of the first channel CH1 through the DQ pin P27 by using the first switch SW1 turned on by the pull-down signal PD of the data logic circuit 127. The low voltage level VL indicates that the DIN bit is logic "0", and may be set lower than the level of the second reference voltage VREF2. Accordingly, the level of the DQ line 700 of the first channel CH1 may be changed to the low voltage level VL of the write data DIN.

From time Tb to time Tc, the output data DOUT of the first NVM 110a may be loaded on the DQ line 700 of the first channel CH1 in a low voltage level (VL) state of the write data DIN. For example, the output data may not exceed the level of the second reference voltage VREF2. The memory controller 120 may select the output of the first comparator 721 based on a selection signal SEL having a logic low level, which is generated by the data logic circuit 127, and obtain the selected output of the first comparator 721 as an internal data signal iDQ. Here, the first comparator 721 compares the voltage level of the output data DOUT applied to the DQ pin P27 with the level of the first reference voltage VREF1 to output the internal data signal iDQ. The second NVM 110b may generate, as internal write data iDIN, an output of the input buffer 714b by comparing the low voltage level VL of write data DIN applied to the DQ pad P17b with the level of the second reference voltage VREF2.

At time Tc, when the DIN bit is logic '1', the memory controller 120 may transmit write data DIN having the high voltage level VH by the data logic circuit 126, the ODT circuit 124, and the switch circuit 125 to the DQ line 700 of the first channel CH1 through the DQ pin P27.

From time Tc to time Td, the output data DOUT of the first NVM 110a may be loaded on the DQ line 700 of the first channel CH1 in a high voltage level (VH) state of the write data DIN. The memory controller 120 may select the output of the second comparator 722 based on a selection signal SEL having a logic high level, which is generated by the data logic circuit 127, and obtain the selected output of the second comparator 722 as an internal data signal iDQ. Here, the second comparator 722 compares the voltage level of the output data DOUT applied to the DQ pin P27 with the level of the third reference voltage VREF3 to output the internal data signal iDQ. The second NVM 110b may obtain, as internal write data iDIN, an output of the input buffer 714b by comparing the low voltage level VL of write data DIN applied to the DQ pad P17b with the level of the second reference voltage VREF2.

According to an embodiment of the inventive concept, the memory controller 120 may obtain internal data IDQ by filtering, e.g., using a high pass filter, high-frequency output data DOUT output from the first NVM 110a. The input buffer 714b of the second NVM 110b may obtain an internal write command iDIN by filtering low-frequency write data DIN of the memory controller 120 by using a low pass filter.

In FIGS. 14 and 15, while the memory controller 120 receives high-frequency output data DOUT of the first NVM 110a, the memory controller 120 may transmit low-frequency write data DIN to the second NVM 110b, and thus, data input/output efficiency and data transmission speed may be increased.

Figure 16:
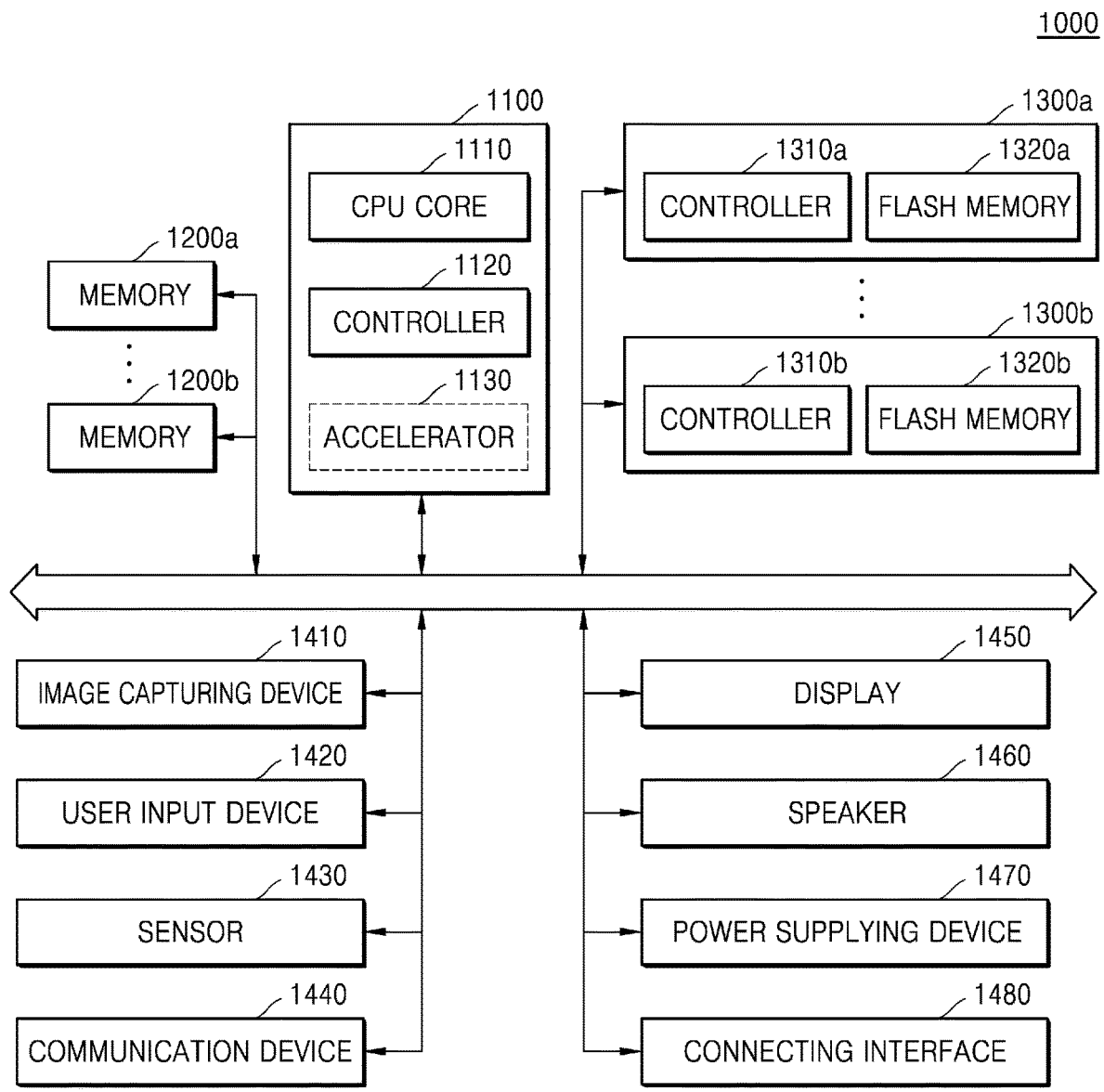
FIG. 16 is a diagram illustrating a system to which a storage device according to embodiments of the inventive concept is applied.

FIG. 16 is a diagram illustrating a system 1000 to which a storage device according to embodiments of the inventive concept is applied. The system 1000 of FIG. 16 may include a mobile system such as a mobile phone, a smart phone, a tablet personal computer (PC), a wearable device, a healthcare device, or an Internet-of-things (IoT) device. However, the system 1000 of FIG. 16 is not limited to the mobile system and may also include a PC, a laptop computer, a server, a media player, or an automotive device such as a navigation device.

Referring to FIG. 16, the system 1000 may include a main processor 1100, memories 1200a and 1200b, and storage devices 1300a and 1300b and may additionally include one or more of an image capturing device 1410, a user input device 1420, a sensor 1430, a communication device 1440, a display 1450, a speaker 1460, a power supplying device 1470, and a connecting interface 1480. Components of the system 1000 may be connected to each other via a bus.

The main processor 1100 may control overall operations of the system 1000, and more particularly, may control operations of other components constituting the system 1000. The main processor 1100 may be a general-purpose processor, a dedicated processor, an application processor, or the like.

The main processor 1100 may include one or more central processing unit (CPU) cores 1110 and may further include a controller 1120 for controlling the memories 1200a and 1200b and/or the storage devices 1300a and 1300b. According to embodiments of the inventive concept, the main processor 1100 may further include an accelerator block 1130, which is a dedicated circuit for high-speed data calculations such as artificial intelligence (AI) data calculations. The accelerator block 1130 may include a graphics processing unit (GPU), a neural processing unit (NPU), and/or a data processing unit (DPU), and may be implemented by a separate chip that is physically independent of the other components.

The memories 1200a and 1200b may be used as a main memory device and may include volatile memory such as SRAM and/or DRAM or may include non-volatile memory such as PRAM and/or RRAM. The memories 1200a and 1200b may also be implemented in the same package as the main processor 1100.

The storage devices 1300a and 1300b may function as non-volatile storage devices storing data regardless of the supply or not of power, and may have relatively larger storage capacities than the memories 1200a and 1200b. The storage devices 1300a and 1300b may include storage controllers 1310a and 1310b, and non-volatile memory (NVM) storages 1320a and 1320b storing data under the control of the storage controllers 1310a and 1310b, respectively. The NVM storages 1320a and 1320b may include V-NAND flash memory having a 2-dimensional (2D) structure or a 3-dimensional (3D) structure or may include another type of non-volatile memory such as PRAM and/or RRAM.

The storage devices 1300a and 1300b may be included in the system 1000 while physically separated from the main processor 1100 or may be implemented in the same package as the main processor 1100. In addition, the storage devices 1300a and 1300b may have a form such as a memory card and thus may be detachably coupled to the other components of the system 1000 through an interface such as the connecting interface 1480 described below. The storage devices 1300a and 1300b may include, but are not limited to, devices to which standard specifications such as UFS are applied.

The image capturing device 1410 may capture still images or moving images and may include a camera, a camcorder, and/or a webcam.

The user input device 1420 may receive various types of data input by a user of the system 1000 and may include a touch pad, a keypad, a keyboard, a mouse, and/or a microphone.

The sensor 1430 may sense various physical quantities, which may be obtained from outside the system 1000, and may convert the sensed physical quantities into electrical signals. The sensor 1430 may include a temperature sensor, a pressure sensor, a luminance sensor, a position sensor, an acceleration sensor, a biosensor, and/or a gyroscope.

The communication device 1440 may perform transmission and reception of signals between the system 1000 and other devices outside the system 1000, according to various communication protocols. The communication device 1440 may include an antenna, a transceiver, and/or a modem.

The display 1450 and the speaker 1460 may function as output devices outputting visual information and auditory information to the user of the system 1000, respectively.

The power supplying device 1470 may appropriately convert power supplied by a battery embedded in the system 1000 and/or by an external power supply and thus supply the converted power to each of the components of the system 1000.

The connecting interface 1480 may provide a connection between the system 1000 and an external device that is connected to the system 1000 and capable of exchanging data with the system 1000. The connecting interface 1480 may be implemented by various interfaces such as Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVM express (NVMe), IEEE 1394, universal serial bus (USB), a secure digital (SD) card interface, a multi-media card (MMC) interface, an eMMC interface, UFS, embedded Universal Flash Storage (eUFS), and a CF card interface.

Figure 17:
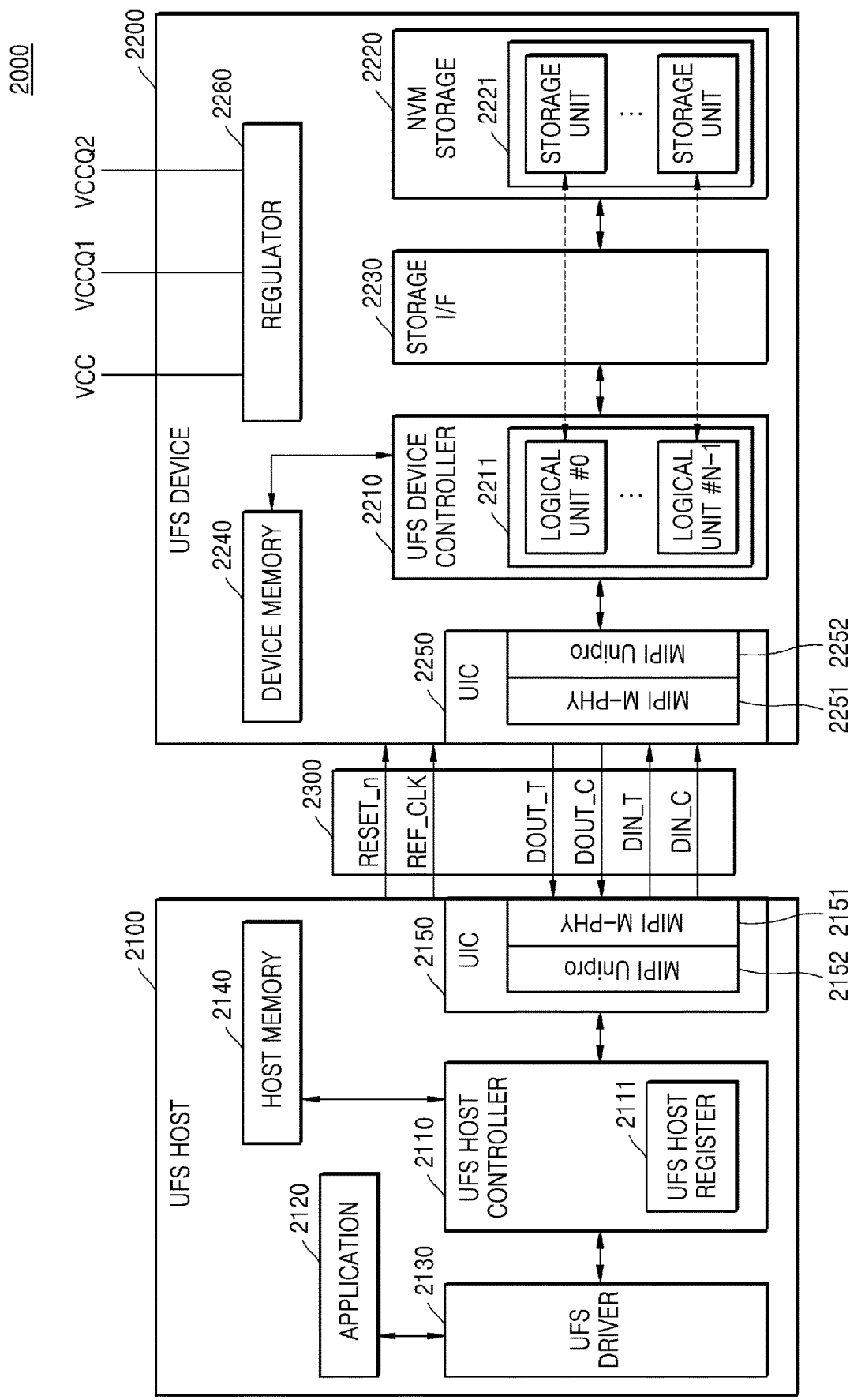
FIG. 17 is a diagram illustrating a universal flash storage (UFS) system according to embodiments of the inventive concept.

FIG. 17 is a diagram illustrating a UFS system 2000 according to embodiments of the inventive concept. The UFS system 2000, which is a system conforming to the UFS standard set forth by the Joint Electron Device Engineering Council (JEDEC), may include a UFS host 2100, a UFS device 2200, and a UFS interface 2300. The above descriptions of the system 1000 of FIG. 16 may also be applied to the UFS system 2000 of FIG. 17 unless conflicting with the following descriptions regarding FIG. 17.

Referring to FIG. 17, the UFS host 2100 and the UFS device 2200 may be connected to each other through the UFS interface 2300. When the main processor 1100 of FIG. 16 is an application processor, the UFS host 2100 may be implemented as a portion of a corresponding application processor. A UFS host controller 2110 and a host memory 2140 may respectively correspond to the controller 1120 and the memories 1200a and 1200b of FIG. 16. The UFS device 2200 may correspond to the storage devices 1300a and 1300b of FIG. 16, and a UFS device controller 2210 and NVM storage 2220 may respectively correspond to the storage controllers 1310a and 1310b and the NVM storages 1320a and 1320b in FIG. 16.

The UFS host 2100 may include the UFS host controller 2110, an application 2120, a UFS driver 2130, the host memory 2140, and a UFS interconnect (UIC) layer 2150. The UFS device 2200 may include the UFS device controller 2210, the NVM storage 2220, a storage interface 2230, a device memory 2240, a UIC layer 2250, and a regulator 2260. The NVM storage 2220 may include a plurality of storage units 2221, and each storage unit 2221 may include V-NAND flash memory having a 2D structure or a 3D structure or may include another type of non-volatile memory such as PRAM and/or RRAM. The UFS device controller 2210 and the NVM storage 2220 may be connected to each other through the storage interface 2230. The storage interface 2230 may be implemented to conform to a standard specification such as Toggle or ONFI.

The application 2120 may refer to a program that intends to communicate with the UFS device 2200 to use a function of the UFS device 2200. The application 2120 may transmit an input-output request to the UFS driver 2130 to perform input to and output from the UFS device 2200. The input-output request may refer to, but is not limited to, a read request, a write request, and/or a discard request of data.

The UFS driver 2130 may manage the UFS host controller 2110 through a UFS-host controller interface (HCI). The UFS driver 2130 may convert the input-output request generated by the application 2120 into a UFS command defined by the UFS standard, and may transfer the converted UFS command to the UFS host controller 2110. One input-output request may be converted into a plurality of UFS commands. Although a UFS command may be a command defined by the SCSI standard, the UFS command may also be a UFS standard-dedicated command.

The UFS host controller 2110 may transmit the UFS command converted by the UFS driver 2130 to the UIC layer 2250 of the UFS device 2200 through the UIC layer 2150 and the UFS interface 2300. In this process, a UFS host register 2111 of the UFS host controller 2110 may perform a role as a command queue.

The UIC layer 2150 of the UFS host 2100 may include MIPI M-PHY 2151 and MIPI UniPro 2152, and the UIC layer 2250 of the UFS device 2200 may also include MIPI M-PHY 2251 and MIPI UniPro 2252.

The UFS interface 2300 may include a line for transmitting a reference clock signal REF_CLK, a line for transmitting a hardware reset signal RESET_n with respect to the UFS device 2200, a pair of lines for transmitting a differential input signal pair DIN_T and DIN_C, and a pair of lines for transmitting a differential output signal pair DOUT_T and DOUT_C.

A frequency value of the reference clock signal REF_CLK provided from the UFS host 2100 to the UFS device 2200 may be, but is not limited to, one of 19.2 MHz, 26 MHz, 38.4 MHz, and 52 MHz. Even while the UFS host 2100 is being operated, in other words, even while data transmission and reception between the UFS host 2100 and the UFS device 2200 is being performed, the frequency value of the reference clock signal REF_CLK may be changed. The UFS device 2200 may generate clock signals having various frequencies from the reference clock signal REF_CLK received from the UFS host 2100, by using a phase-locked loop (PLL) or the like. In addition, the UFS host 2100 may also set a value of a data rate between the UFS host 2100 and the UFS device 2200, based on the frequency value of the reference clock signal REF_CLK. In other words, the value of the data rate may be determined according to the frequency value of the reference clock signal REF_CLK.

The UFS interface 2300 may support a plurality of lanes, and each lane may be implemented by a differential pair. For example, a UFS interface may include one or more reception lanes and one or more transmission lanes. In FIG. 17, the pair of lines for transmitting the differential input signal pair DIN_T and DIN_C may constitute a reception lane, and the pair of lines for transmitting the differential output signal pair DOUT_T and DOUT_C may constitute a transmission lane. Although one transmission lane and one reception lane are illustrated in FIG. 17, the respective numbers of transmission lanes and reception lanes may be changed.

The reception lane and the transmission lane may transfer data in a serial communication manner, and full-duplex type communication between the UFS host 2100 and the UFS device 2200 may be allowed due to a structure in which the reception lane is separated from the transmission lane. In other words, even while receiving data from the UFS host 2100 through the reception lane, the UFS device 2200 may transmit data to the UFS host 2100 through the transmission lane. In addition, control data such as a command from the UFS host 2100 to the UFS device 2200, and user data, which the UFS host 2100 intends to store in the NVM storage 2220 of the UFS device 2200 or to read from the NVM storage 2220, may be transferred through the same lane. Accordingly, there is no need to further arrange, between the UFS host 2100 and the UFS device 2200, a separate lane for data transfer, in addition to a pair of reception lanes and a pair of transmission lanes.

The UFS device controller 2210 of the UFS device 2200 may take overall control of operations of the UFS device 2200. The UFS device controller 2210 may manage the NVM storage 2220 through a logical unit (LU) 2211, which is a logical data storage unit. The number of LUs 2211 may be, but is not limited to, 8. The UFS device controller 2210 may include a flash translation layer (FTL) and, by using address mapping information of the FTL, may convert a logical data address, for example, a logical block address (LBA), which is transferred from the UFS host 2100, into a physical data address, for example, a physical block address (PBA). In the UFS system 2000, a logical block for storing user data may have a size in a certain range. For example, a minimum size of the logical block may be set to be 4 Kbyte.

When a command from the UFS host 2100 is input to the UFS device 2200 through the UIC layer 2250, the UFS device controller 2210 may perform an operation according to the input command, and when the operation is completed, the UFS device controller 2210 may transmit a completion response to the UFS host 2100.

For example, when the UFS host 2100 intends to store user data in the UFS device 2200, the UFS host 2100 may transmit a data storage command to the UFS device 2200. When a response indicative of being ready to receive the user data is received from the UFS device 2200, the UFS host 2100 may transmit the user data to the UFS device 2200. The UFS device controller 2210 may temporarily store the received user data in the device memory 2240 and, based on the address mapping information of the FTL, may store the user data temporarily stored in the device memory 2240 in a selected location of the NVM storage 2220.

As another example, when the UFS host 2100 intends to read the user data stored in the UFS device 2200, the UFS host 2100 may transmit a data read command to the UFS device 2200. The UFS device controller 2210 having received the data read command may read the user data from the NVM storage 2220, based on the data read command, and may temporarily store the read user data in the device memory 2240. In this data read process, the UFS device controller 2210 may detect and correct an error in the read user data, by using an embedded error correction code (ECC) circuit. In addition, the UFS device controller 2210 may transmit the user data temporarily stored in the device memory 2240 to the UFS host 2100. Further, the UFS device controller 2210 may further include an advanced encryption standard (AES) circuit, and the AES circuit may encrypt or decrypt data, which is input to the UFS device controller 2210, by using a symmetric-key algorithm.

The UFS host 2100 may store commands, which are to be transmitted to the UFS device 2200, in the UFS host register 2111 capable of functioning as a command queue according to an order, and may transmit the commands to the UFS device 2200 in the order. Here, even when a previously transmitted command is still being processed by the UFS device 2200, in other words, even before the UFS host 2100 receives a notification indicating that processing of the previously transmitted command is completed by the UFS device 2200, the UFS host 2100 may transmit the next command on standby in the command queue to the UFS device 2200, and thus, the UFS device 2200 may also receive the next command from the UFS host 2100 even while processing the previously transmitted command. The maximum number of commands capable of being stored in the command queue (in other words, a queue depth) may be, for example, 32. In addition, the command queue may be implemented by a circular queue type in which a start and an end of a command sequence stored in a queue are respectively indicated by a head pointer and a tail pointer.

Each of the plurality of storage units 2221 may include a memory cell array and a control circuit for controlling an operation of the memory cell array. The memory cell array may include a 2D memory cell array or a 3D memory cell array. The memory cell array may include a plurality of memory cells, and each memory cell may be a single level cell (SL) storing 1 bit of information or may be a cell storing 2 or more bits of information, such as a multi-level cell (MLC), a triple level cell (TLC), or a quadruple level cell (QLC). The 3D memory cell array may include a vertical NAND string vertically oriented such that at least one memory cell is located on another memory cell.

VCC, VCCQ1, VCCQ2, or the like may be input as a power supply voltage to the UFS device 2200. VCC, which is a main power supply voltage for the UFS device 2200, may have a value of about 2.4 V to about 3.6 V. VCCQ1, which is a power supply voltage for supplying a voltage in a low-voltage range, is mainly for the UFS device controller 2210 and may have a value of about 1.14 V to about 1.26 V. VCCQ2, which is a power supply voltage for supplying a voltage in a range higher than VCCQ1 and lower than VCC, is mainly for an input-output interface such as the MIPI M-PHY 2251 and may have a value of about 1.7 V to about 1.95 V. The power supply voltages set forth above may be supplied for the respective components of the UFS device 2200 through the regulator 2260. The regulator 2260 may be implemented by a set of unit regulators respectively connected to different ones of the power supply voltages set forth above.

In an embodiment of the inventive concept, when, for example, the memory controller transmits a read command to another non-volatile memory through the shared DQ line while receiving the output data of a selected non-volatile memory through the shared DQ line, simultaneously and in both directions of the channel, data input/output efficiency of the storage device may be increased to thereby improve data transmission performance.

While the inventive concept has been particularly shown and described with reference to embodiments thereof, it will be understood that various changes in form and details may be made thereto without departing from the spirit and scope of the inventive concept as set forth in the following claims.

What is claimed is:

1. A method of operating a storage device including first and second memory devices and a memory controller, which are connected to a single channel, the method comprising:
transmitting first data output from the first memory device to the memory controller through a data signal line in the single channel; and
transmitting a command to the second memory device through the data signal line, wherein the first data and the command are loaded on the data signal line at the same time,
wherein a voltage level of the data signal line is based on the command and the first data of the first memory device is loaded on the data signal line, and
the first data and the command are transmitted in both directions of the data signal line.

2. The method of claim 1, wherein the first data is transmitted to the memory controller at a transmission rate of a first frequency, and the command is transmitted to the second memory device at a transmission rate of a second frequency,
wherein the first frequency is higher than the second frequency.

3. The method of claim 1, wherein a state of the data signal line is changed to a state of a high voltage level when a command signal bit for the second memory device is logic high, and is changed to a state of a low voltage level when the command signal bit is logic low,
wherein the high voltage level is higher than a second reference voltage level that is between a power voltage level and a ground voltage level of the storage device, and the low voltage level is lower than the second reference voltage level.

4. The method of claim 3, further comprising:
extracting, by the memory controller, internal data corresponding to the first data received through the data signal line,
wherein the extracting of the internal data includes:
comparing, by the memory controller, the first data, loaded in the state of the low voltage level on the data signal line, with a first reference voltage level that is lower than the second reference voltage level and outputting the internal data; and
comparing, by the memory controller, the first data, loaded in the state of the high voltage level on the data signal line, with a third reference voltage level that is higher than the second reference voltage level and outputting the internal data.

5. The method of claim 3, further comprising:
extracting, by the second memory device, an internal command corresponding to the command for the second memory device received through the data signal line,
wherein the extracting of the internal command includes comparing, by the second memory device, the command for the second memory device, loaded on the data signal line, with the second reference voltage level and outputting the internal command.

6. The method of claim 1, further comprising:
transmitting, by the memory controller, a first page read command to the first memory device;
performing, by the first memory device, a first page read operation for memory cells in response to the first page read command; and
transmitting, by the memory controller, a first random read command to the first memory device after the first page read operation is performed,
wherein the first memory device transmits the first data to the memory controller in response to the first random read command, and
the command for the second memory device is a second random read command applied to the second memory device.

7. The method of claim 6, further comprising:
transmitting, by the memory controller, a second page read command to the second memory device after transmitting the first page read command to the first memory device; and
performing, by the second memory device, a second page read operation for memory cells in response to the second page read command,
wherein the second random read command is transmitted to the second memory device when the first data of the first memory device is output through the data signal line after the second page read operation is performed.

8. A method of operating a storage device including first and second memory devices and a memory controller, which are connected to a single channel, the method comprising:
transmitting first data output from the first memory device to the memory controller through a data signal line in the single channel; and
transmitting write data for the second memory device to the second memory device through the data signal line, wherein the first data and the write data are loaded on the data signal line at the same time,
wherein a voltage level of the data signal line is based on the write data and the first data is loaded on the data signal, and
the first data and the write data are transmitted in both directions of the data signal line in the single channel.

9. The method of claim 8, wherein the first data is transmitted to the memory controller at a transmission rate of a first frequency, and the write data is transmitted to the second memory device at a transmission rate of a second frequency,
wherein the first frequency is higher than the second frequency.

10. The method of claim 8, wherein a state of the data signal line is changed to a state of a high voltage level when a write data bit for the second memory device is logic high, and is changed to a state of a low voltage level when the write data bit is logic low, wherein the high voltage level is higher than a second reference voltage level that is between a power voltage level and a ground voltage level of the storage device, and the low voltage level is lower than the second reference voltage level.

11. The method of claim 10, further comprising:

extracting, by the memory controller, internal data corresponding to the first data received through the data signal line, wherein the extracting of the internal data includes:

comparing, by the memory controller, the first data, loaded in the state of the low voltage level on the data signal line, with a first reference voltage level that is lower than the second reference voltage level and outputting the internal data; and comparing, by the memory controller, the first data, loaded in the state of the high voltage level on the data signal line, with a third reference voltage level that is higher than the second reference voltage level and outputting the internal data.

12. The method of claim 10, further comprising:

extracting, by the second memory device, internal write data corresponding to the write data received through the data signal line, wherein the extracting of the internal write data includes comparing, by the second memory device, the write data, loaded on the data signal line, with the second reference voltage level and outputting the internal write data.

* * * * *